United States Patent
Li et al.

(10) Patent No.: US 12,477,739 B2
(45) Date of Patent: Nov. 18, 2025

(54) MANUFACTURING METHOD FOR NONVOLATILE CHARGE-TRAPPING MEMORY APPARATUS

(71) Applicant: eMemory Technology Inc., Hsin-Chu (TW)

(72) Inventors: Chun-Hsiao Li, Hsinchu County (TW); Tsung-Mu Lai, Hsinchu County (TW); Cheng-Yen Shen, Hsinchu County (TW); Chia-Jung Hsu, Hsinchu County (TW)

(73) Assignee: EMEMORY TECHNOLOGY INC., Hsin-Chu (TW)

( * ) Notice: Subject to any disclaimer, the term of this patent is extended or adjusted under 35 U.S.C. 154(b) by 392 days.

(21) Appl. No.: 18/119,951

(22) Filed: Mar. 10, 2023

(65) Prior Publication Data
US 2023/0292516 A1    Sep. 14, 2023

Related U.S. Application Data

(60) Provisional application No. 63/408,462, filed on Sep. 20, 2022, provisional application No. 63/318,805, filed on Mar. 11, 2022.

(51) Int. Cl.
H10B 43/30 (2023.01)
H10D 30/01 (2025.01)

(52) U.S. Cl.
CPC ......... *H10B 43/30* (2023.02); *H10D 30/0413* (2025.01)

(58) Field of Classification Search
CPC .... H10B 43/30; H10B 43/40; H10D 30/0413; H10D 30/69; H10D 64/68
See application file for complete search history.

(56) References Cited

U.S. PATENT DOCUMENTS

| | | | |
|---|---|---|---|
| 6,388,295 B1 * | 5/2002 | Yamashita | H01L 21/761 257/E21.63 |
| 6,946,349 B1 | 9/2005 | Lee | |
| 8,071,453 B1 | 12/2011 | Ramkumar | |
| 8,143,129 B2 | 3/2012 | Ramkumar | |
| 8,258,027 B2 | 9/2012 | Smith | |
| 8,409,950 B1 | 4/2013 | Shea | |
| 8,916,432 B1 | 12/2014 | Ramkumar | |
| 9,793,284 B1 | 10/2017 | Ramkumar | |
| 10,002,878 B2 | 6/2018 | Prabhakar | |
| 11,011,535 B1 * | 5/2021 | Xiang | H10D 64/037 |

(Continued)

FOREIGN PATENT DOCUMENTS

| CN | 103632942 A | 3/2014 |
|---|---|---|
| CN | 106887433 A | 6/2017 |
| TW | I661541 B | 6/2019 |

*Primary Examiner* — Teresa M. Arroyo
(74) *Attorney, Agent, or Firm* — WPAT, PC

(57) ABSTRACT

A manufacturing method for a nonvolatile charge-trapping memory apparatus is provided. During the manufacturing process of the nonvolatile memory apparatus, a blocking layer of a storage device is effectively protected. Consequently, the blocking layer is not contaminated or thinned. Moreover, since the well regions of the logic device area and the memory device area are not simultaneously fabricated, it is feasible to fabricate small-sized nonvolatile memory cell in the memory device area and precisely control the threshold voltage of the charge trapping transistor.

15 Claims, 20 Drawing Sheets

(56) References Cited

U.S. PATENT DOCUMENTS

2003/0022445 A1\* 1/2003 Taniguchi ............ H10D 84/013
438/257
2008/0145985 A1\* 6/2008 Chi ........................ B82Y 10/00
257/E21.679

\* cited by examiner

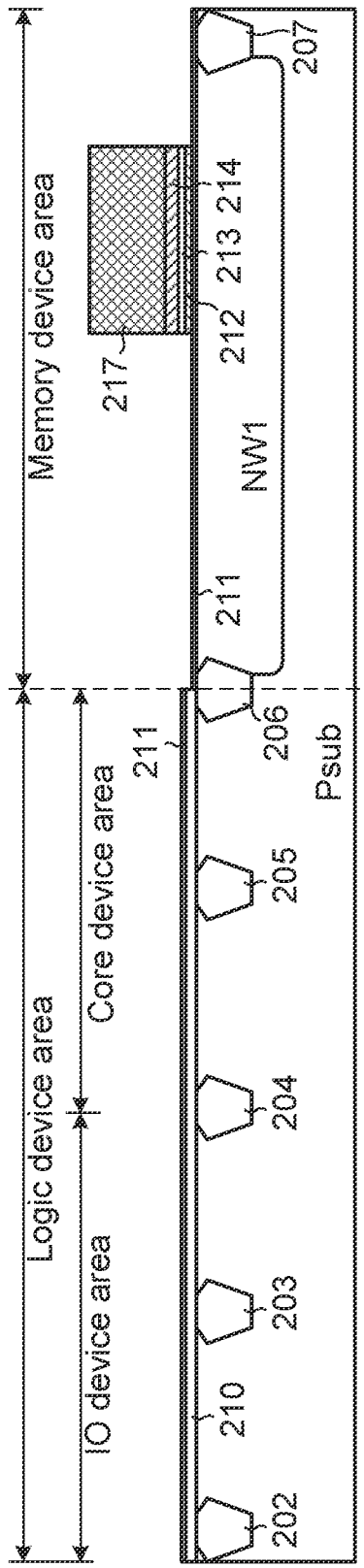
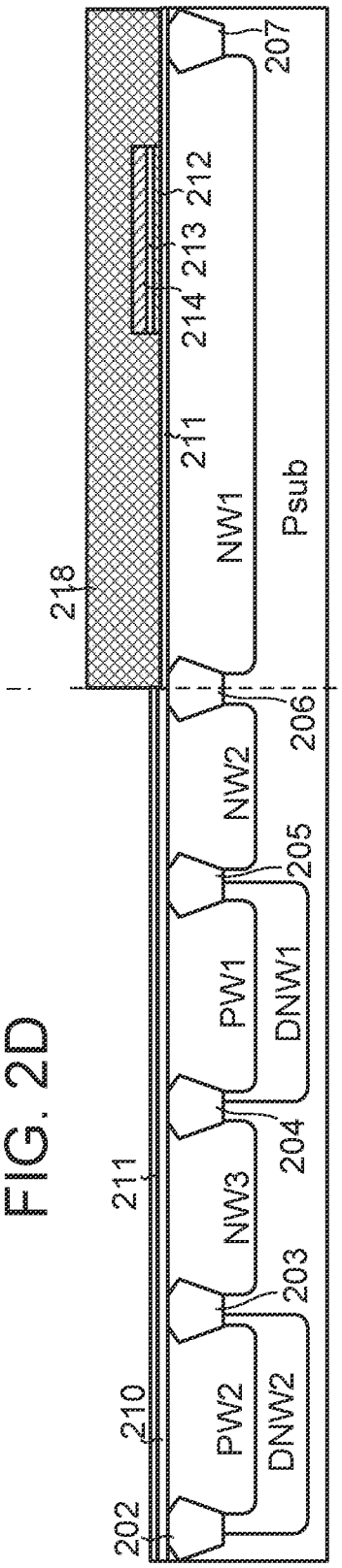
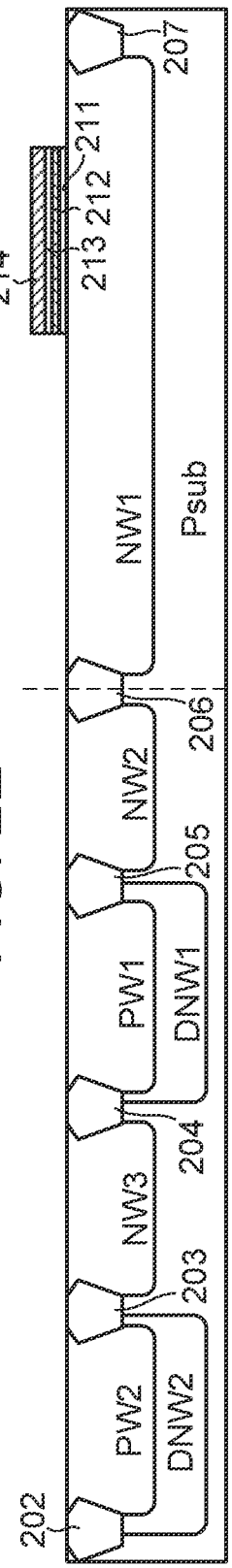

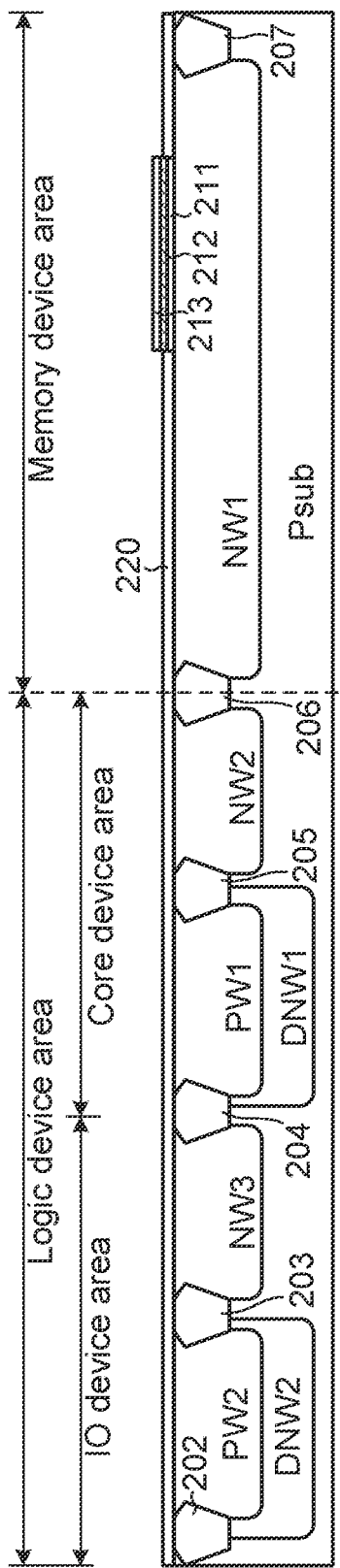
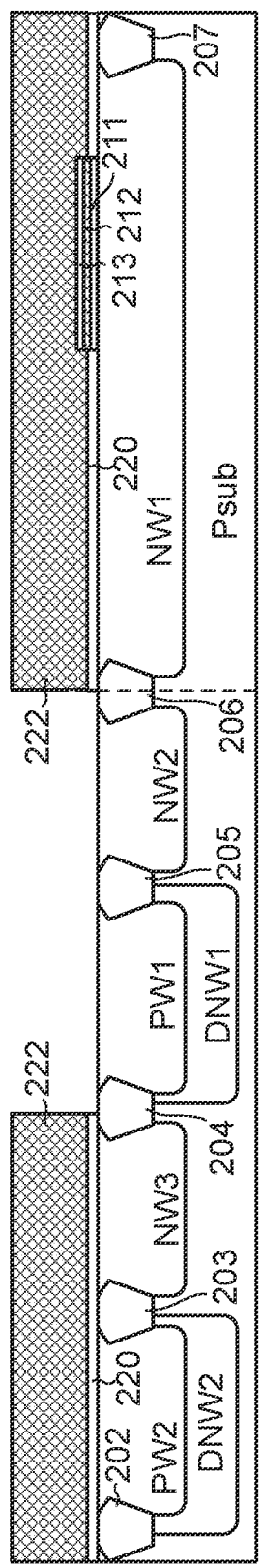
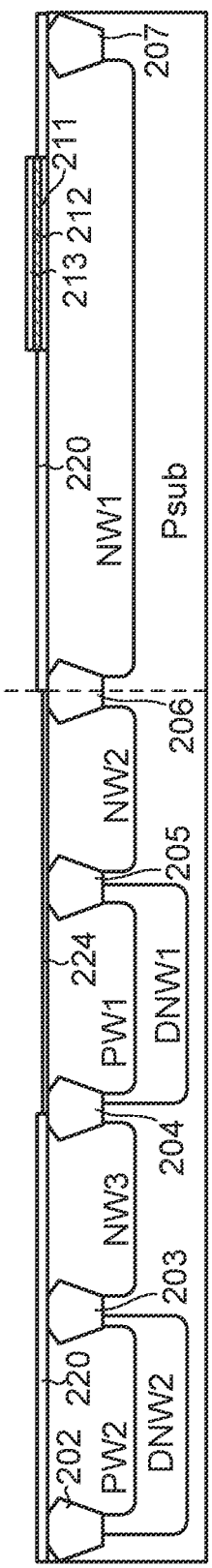
FIG. 2G
FIG. 2H
FIG. 2I

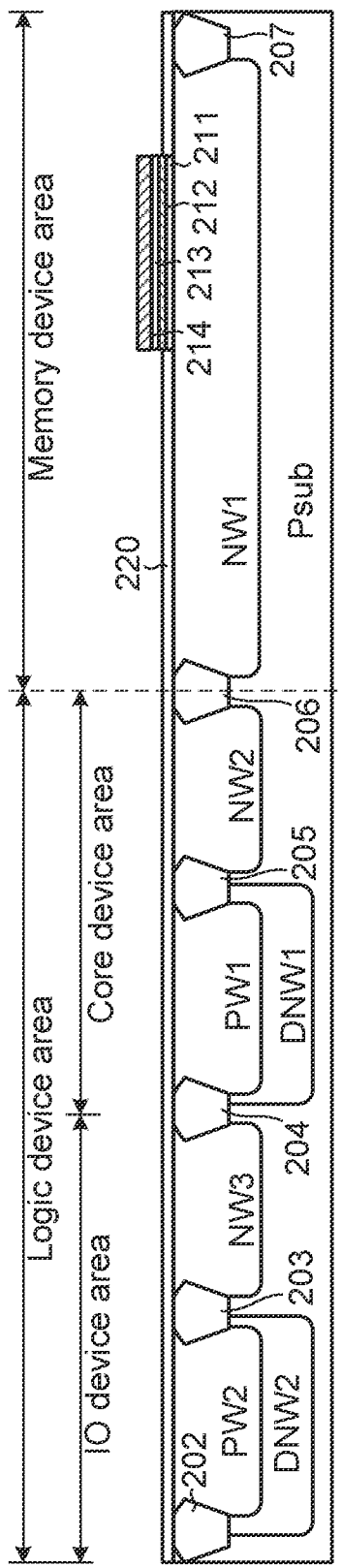
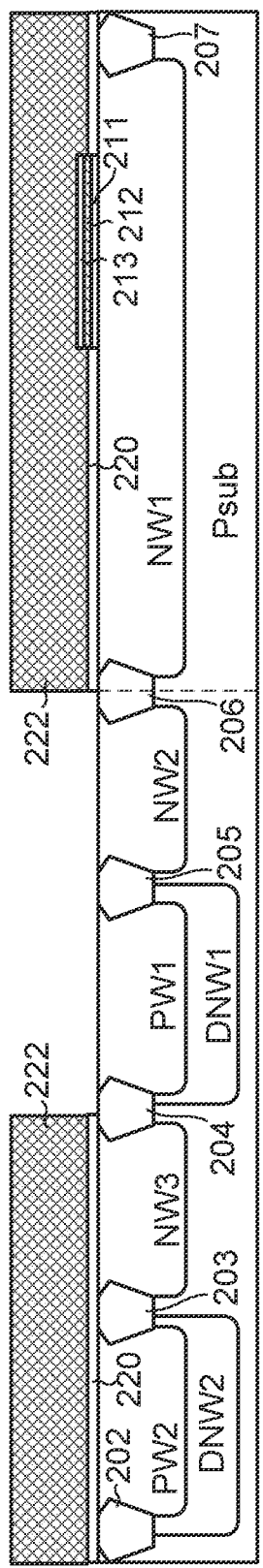
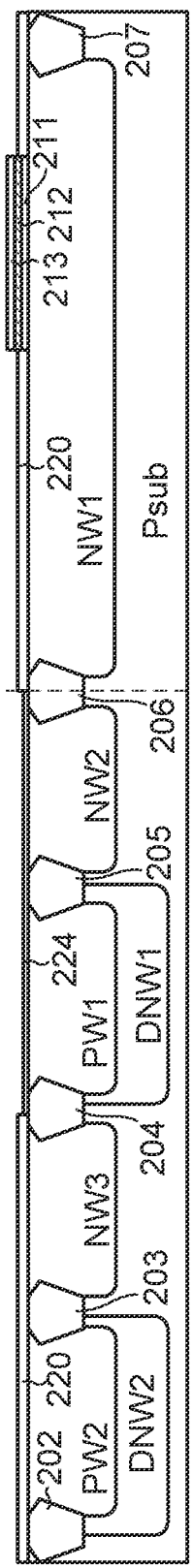
FIG. 3A
FIG. 3B
FIG. 3C

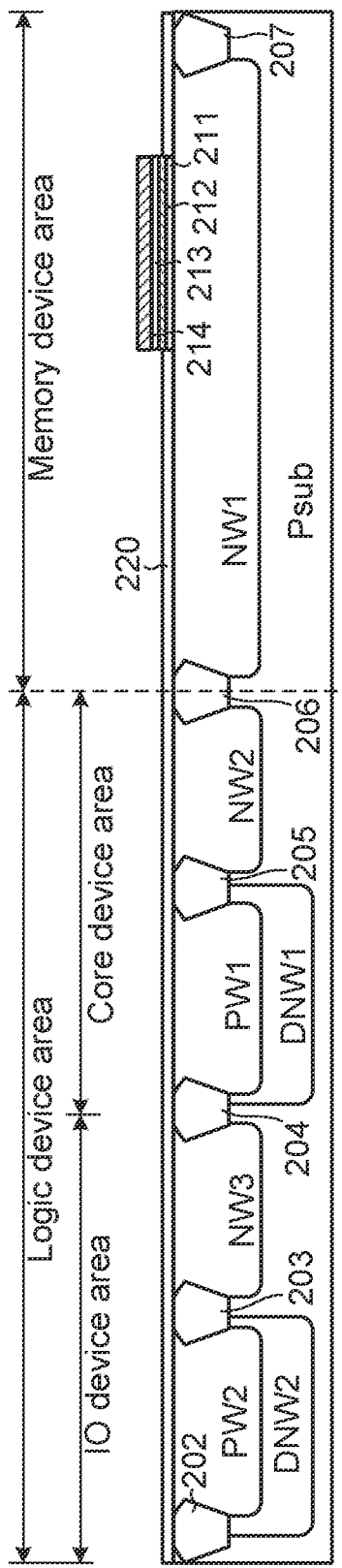
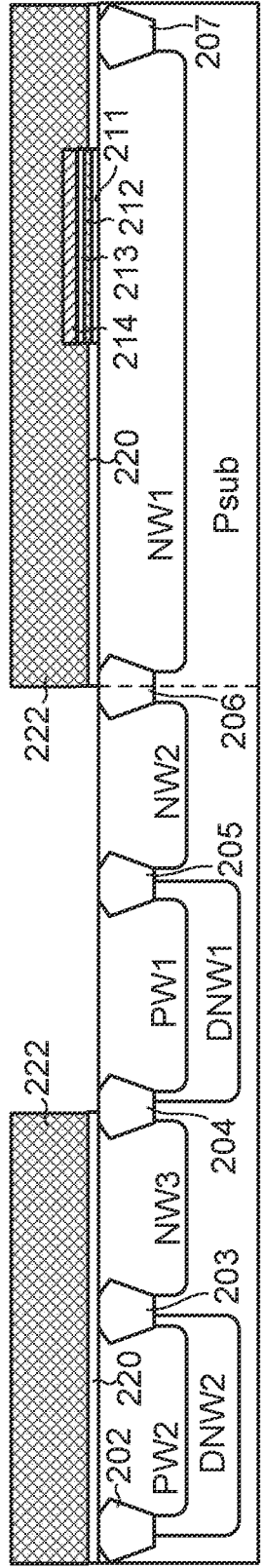
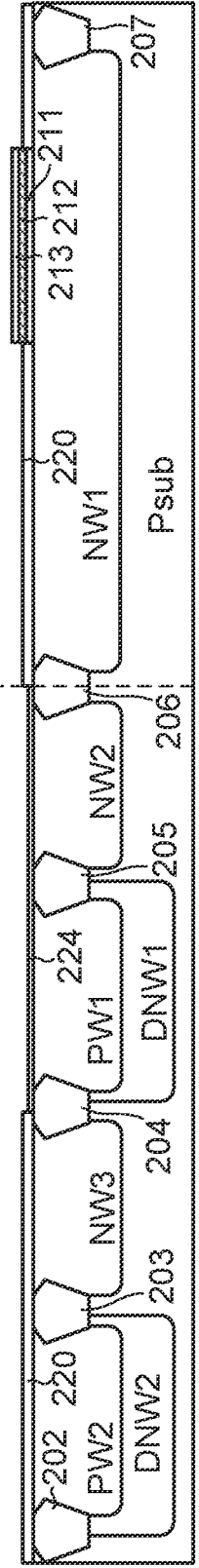

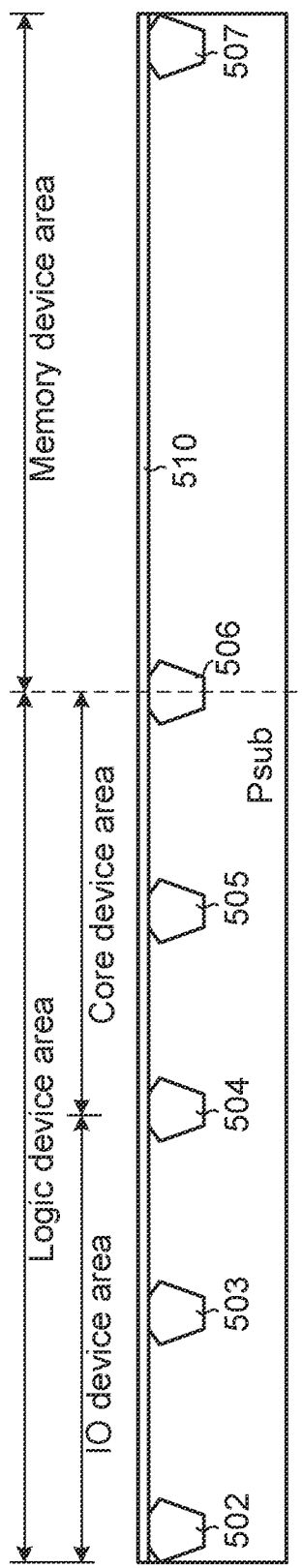
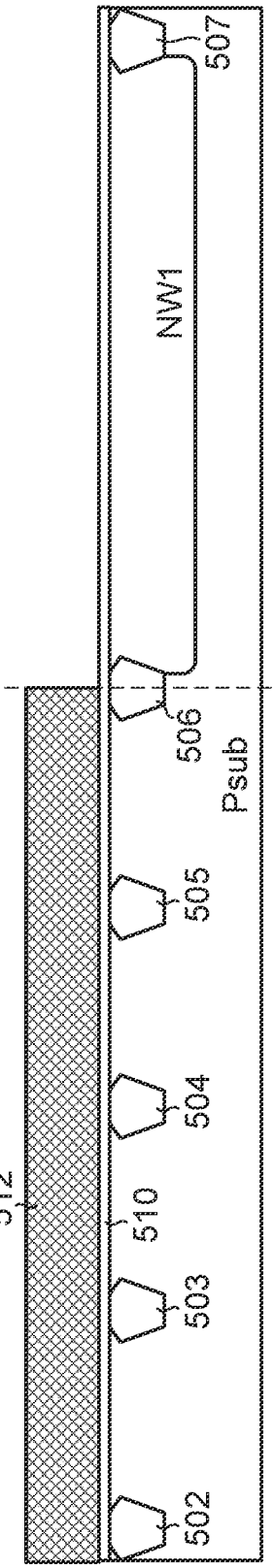
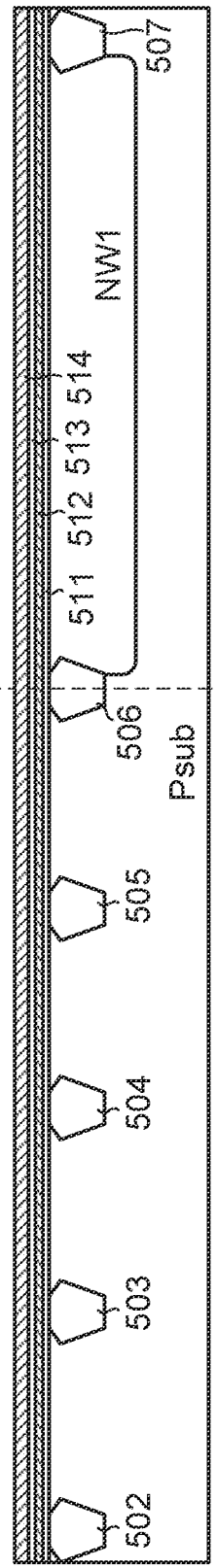
FIG. 5A
FIG. 5B
FIG. 5C

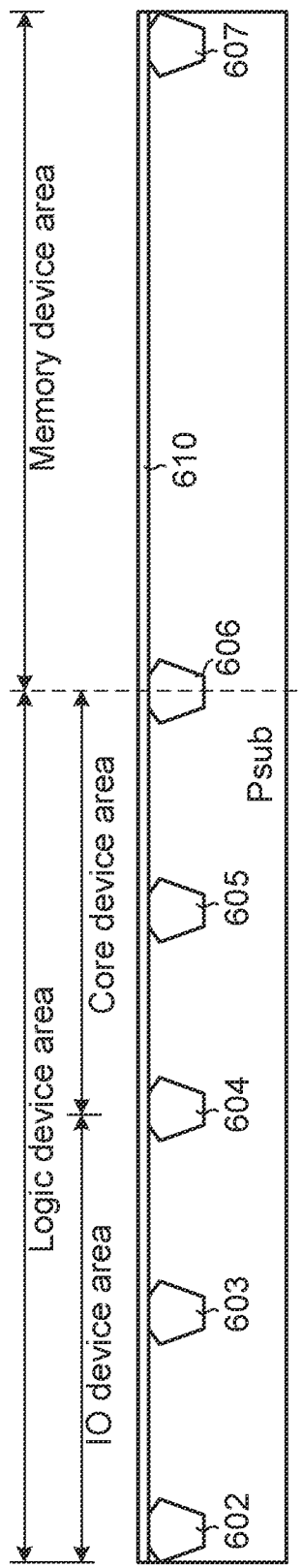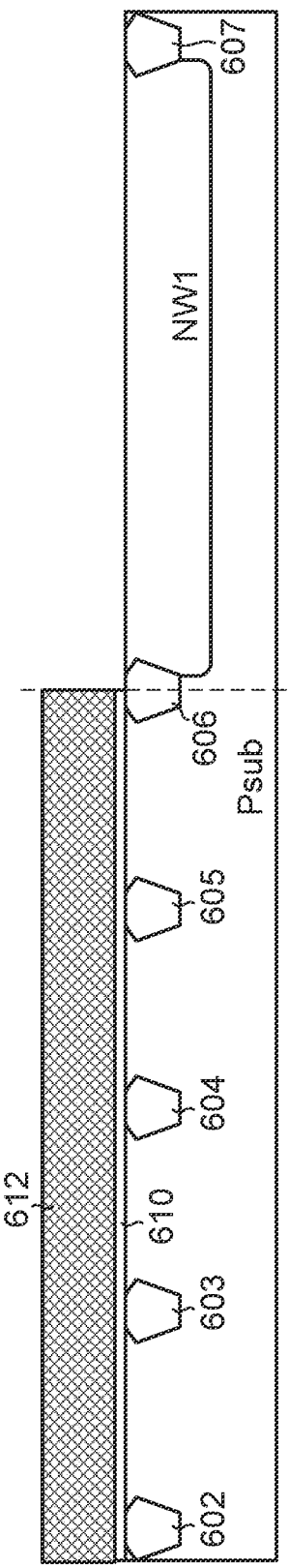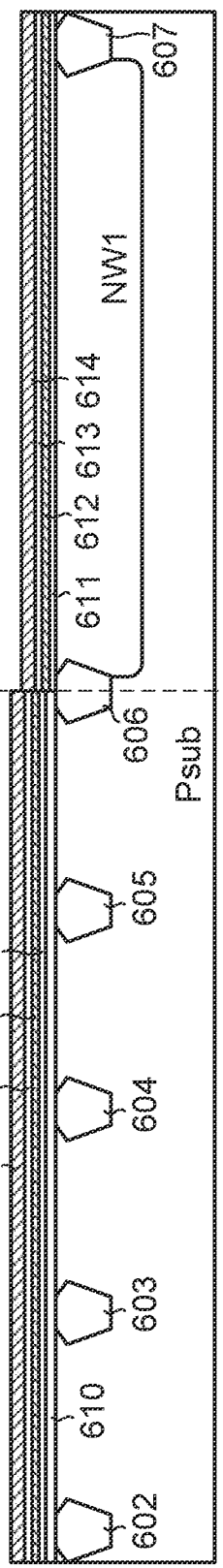

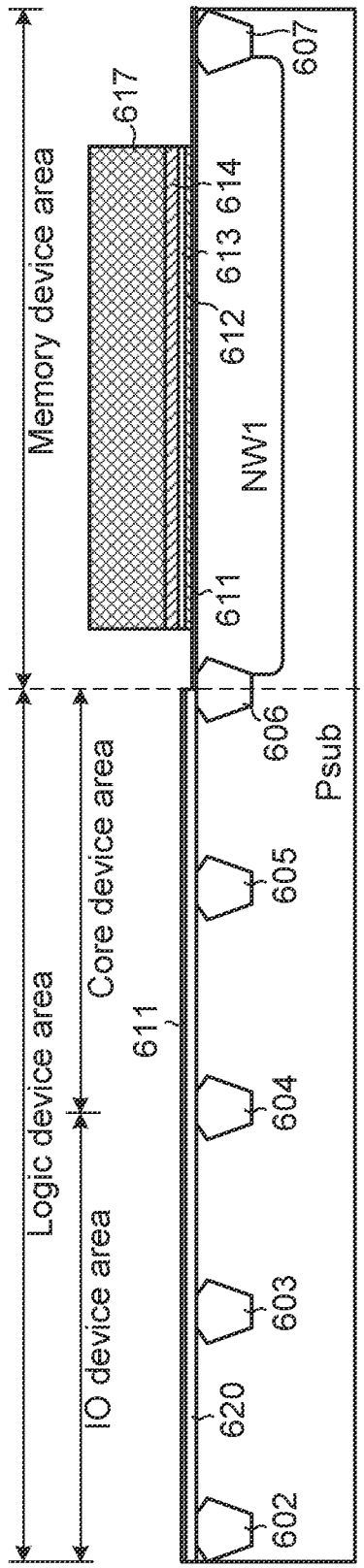
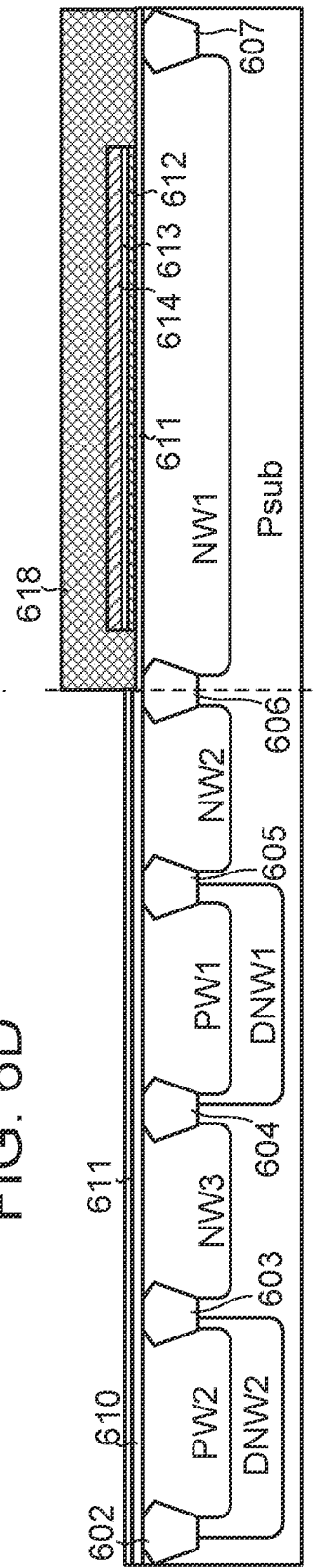
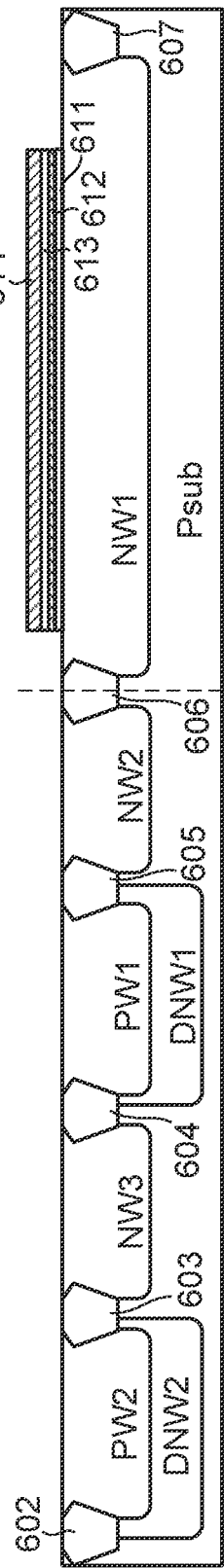
FIG. 6D
FIG. 6E
FIG. 6F

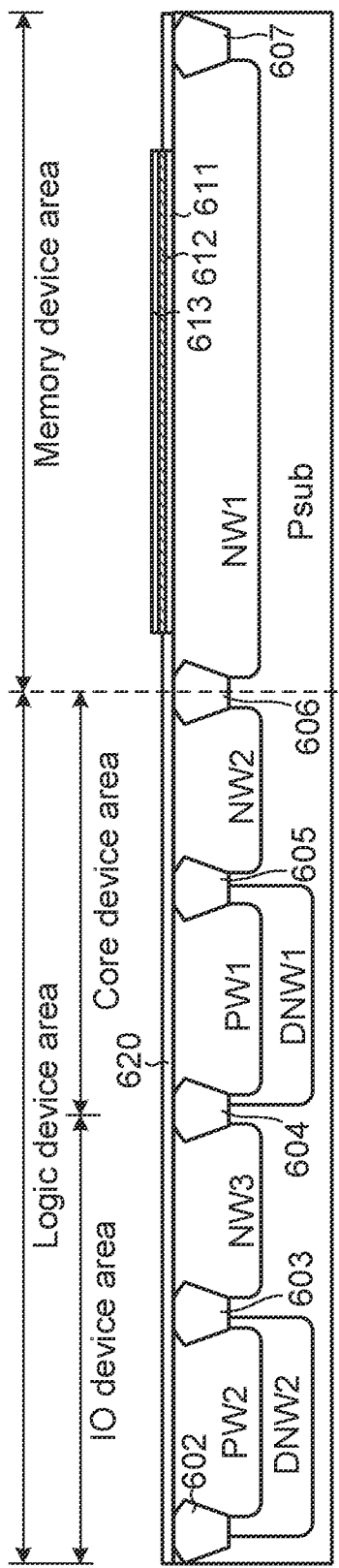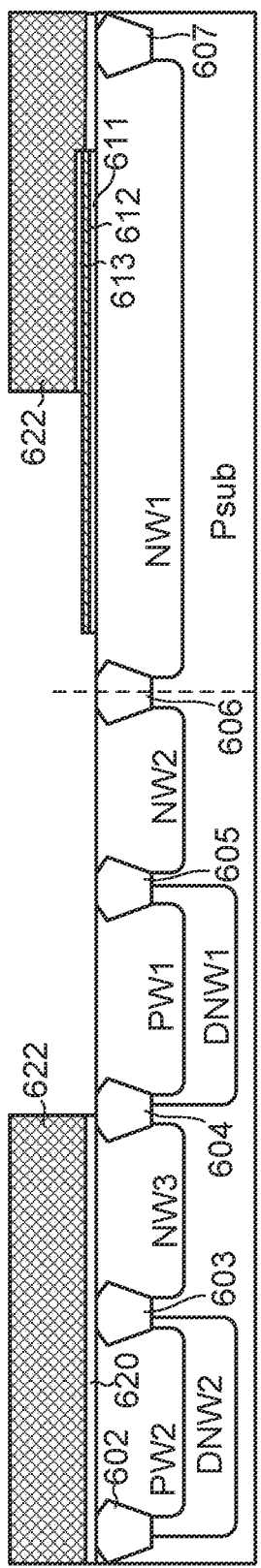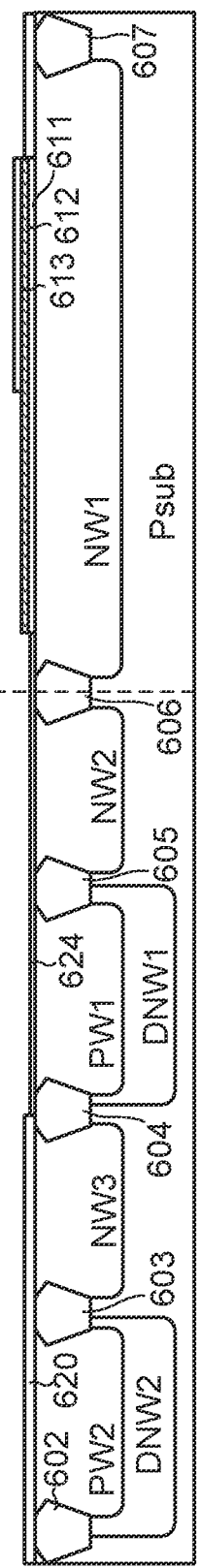

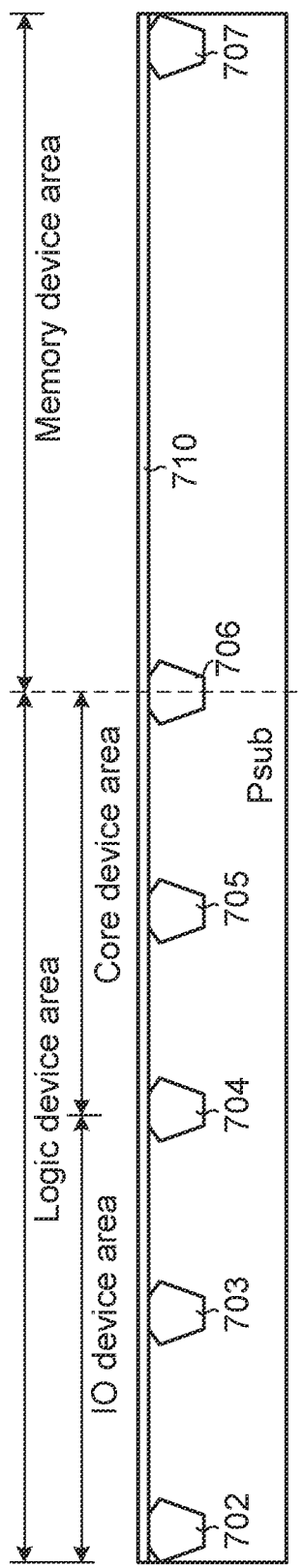
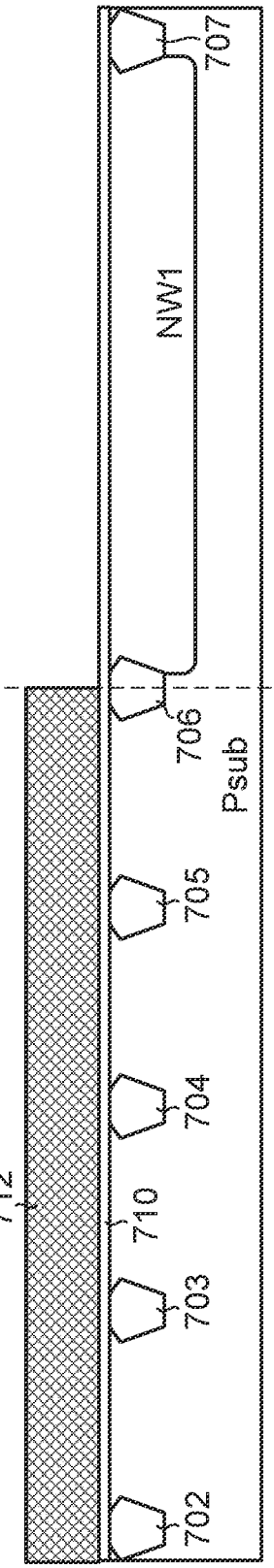
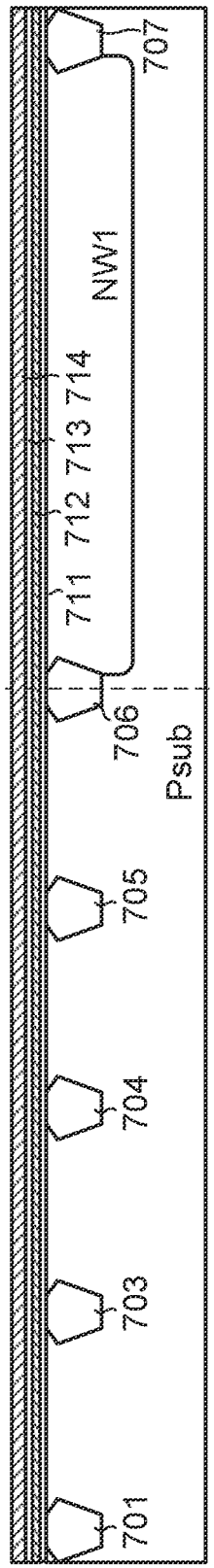

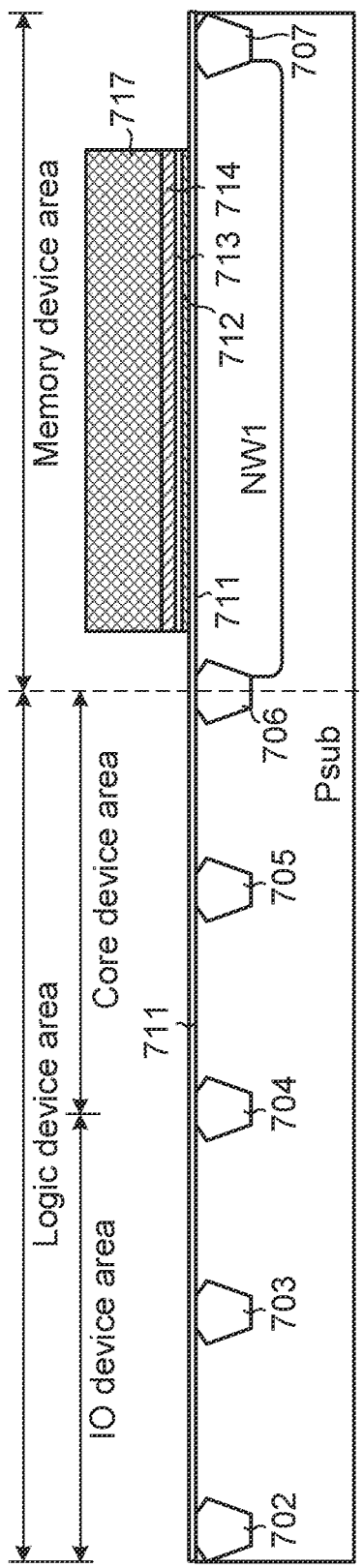
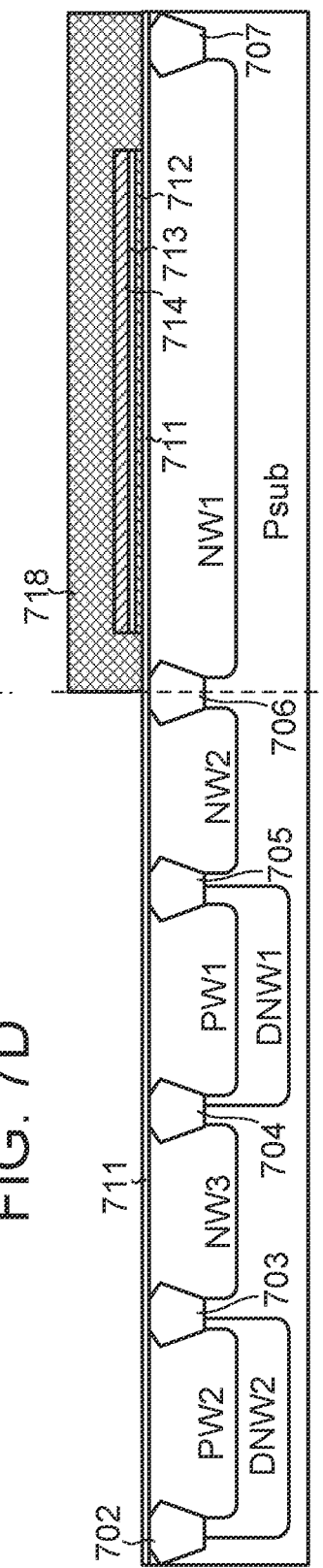
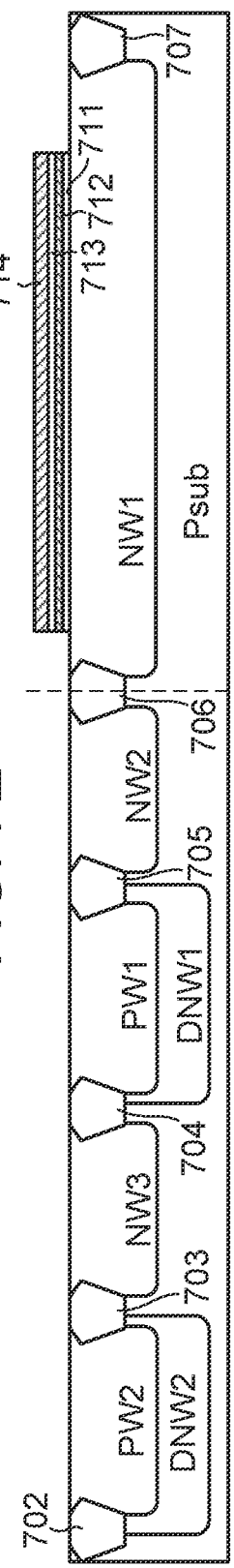
FIG. 7D
FIG. 7E
FIG. 7F

MANUFACTURING METHOD FOR NONVOLATILE CHARGE-TRAPPING MEMORY APPARATUS

This application claims the benefit of U.S. provisional application Ser. No. 63/318,805, filed Mar. 11, 2022, and U.S. provisional application Ser. No. 63/408,462, filed Sep. 20, 2022, the subject matters of which are incorporated herein by references.

FIELD OF THE INVENTION

The present invention relates to a manufacturing method for a nonvolatile memory apparatus, and more particularly to a manufacturing method for a nonvolatile charge-trapping memory apparatus.

BACKGROUND OF THE INVENTION

As is well known, a nonvolatile memory apparatus is able to continuously retain data after the supplied power is interrupted. Consequently, nonvolatile memory apparatuses have been widely applied to various electronic products. Generally, a nonvolatile memory apparatus comprises a peripheral circuit and a memory cell array. The peripheral circuit and the memory cell array are usually fabricated on the same semiconductor substrate. For example, the peripheral circuit comprises a bit line driver, a word line driver, a source line driver and a control unit. The memory cell array is composed of plural nonvolatile memory cells.

In the manufacturing process of the nonvolatile memory apparatus, the layout area of the semiconductor substrate is usually divided into a logic device area and a memory device area by the designer. The devices in the logic device area are collaboratively formed as the peripheral circuit of the nonvolatile memory apparatus. The devices in the memory device area are collaboratively formed as the memory cell array of the nonvolatile memory apparatus.

Generally, the devices in the logic device area are classified into input/output devices (or IO devices) and core devices. In addition, the devices in the memory device area are classified into switching devices and storage devices. Each nonvolatile memory cell comprises a switching device and a storage device.

The core devices are also referred to as low voltage devices (or LV devices) such as LV P-type transistors and LV N-type transistors. The IO devices are also referred as high voltage devices (or HV devices) such as HV P-type transistors and HV N-type transistors. The LV device can withstand a low voltage stress. The HV device can withstand a higher voltage stress.

Since the above-mentioned IO devices, core devices, switching devices and storage devices have different circuitry structures, it will be a challenging task to integrate the peripheral circuit and the memory cell array on the same semiconductor substrate.

SUMMARY OF THE INVENTION

An embodiment of the present invention provides a manufacturing method for a nonvolatile charge-trapping memory apparatus. The manufacturing method includes the following steps of: (A) forming a pad oxide layer on a surface of a semiconductor substrate, and forming plural isolation structures in the semiconductor substrate, wherein through the plural isolation structure, the semiconductor substrate is divided into a memory device area and a logic device area, and the logic device area is divided into an input/output device area and a core device area; (B) forming a first photoresist layer to cover the logic device area, and forming a first first-type well region under the surface of the semiconductor substrate and in the memory device area; (C) removing the first photoresist layer and at least a portion of the pad oxide layer, and forming a stack layer in the logic device area and the memory device area, wherein the stack layer comprises a bottom oxide layer, a trapping layer, a blocking layer and a protecting layer; (D) forming a second photoresist layer to cover a portion of the stack layer in the memory device area, and removing portions of the protecting layer, the blocking layer and the trapping layer that are not covered by the second photoresist layer; (E) removing the second photoresist layer, and forming a third photoresist layer to cover the memory device area; (F) forming a second first-type well region, a first second-type well region and a first deep first-type well region under the surface of the semiconductor substrate and in the core device area, and forming a third first-type well region, a second second-type well region and a second deep first-type well region under the surface of the semiconductor substrate and in the input/output device area, wherein the first second-type well region is formed in the first deep first-type well region, and the second second-type well region is formed in the second deep first-type well region; (G) removing the third photoresist layer, and removing a portion of the bottom oxide layer that are not covered by the protecting layer; (H) removing the protecting layer of the stack layer, forming an input/output gate oxide layer on the surface of the semiconductor substrate and in the memory device area, forming the input/output gate oxide layer on the surface of the semiconductor substrate and in the input/output device area, and forming a core gate oxide layer on the surface of the semiconductor substrate and in the core device area; (I) forming a gate layer to cover the memory device area and the logic device area; and, (J) forming plural gate structures, and forming plural doped regions. A first gate structure is formed over the first first-type well region, a first second-type doped region is formed in the first first-type well region and located beside a first side of the first gate structure, and a second second-type doped region is formed in the first first-type well region and located beside a second side of the first gate structure, wherein a second gate structure is formed over the first first-type well region, the second-type doped region is further located beside a first side of the second gate structure, and a third second-type doped region is formed in the first first-type well region and located beside a second side of the second gate structure. A third gate structure is formed over the second first-type well region, a fourth second-type doped region is formed in the second first-type well region and located beside a first side of the third gate structure, and a fifth second-type doped region is formed in the second first-type well region and located beside a second side of the third gate structure, wherein a fourth gate structure is formed over the first second-type well region, a first first-type doped region is formed in the first second-type well region and located beside a first side of the fourth gate structure, and a second first-type doped region is formed in the first second-type well region and located beside a second side of the fourth gate structure. A fifth gate structure is formed over the third first-type well region, a sixth second-type doped region is formed in the third first-type well region and located beside a first side of the fifth gate structure, and a seventh second-type doped region is formed in the third first-type well region and located beside a second side of the fifth gate structure, wherein a sixth gate structure is formed over the second second-type well region, a third first-type doped region is formed in the second second-type well region and located beside a first side of the sixth gate structure, and a fourth first-type doped region is formed in the second second-type well region and located beside a second side of the sixth gate structure.

Numerous objects, features and advantages of the present invention will be readily apparent upon a reading of the following detailed description of embodiments of the present invention when taken in conjunction with the accompanying drawings. However, the drawings employed herein are for the purpose of descriptions and should not be regarded as limiting.

BRIEF DESCRIPTION OF THE DRAWINGS

The above objects and advantages of the present invention will become more readily apparent to those ordinarily skilled in the art after reviewing the following detailed description and accompanying drawings, in which:

FIGS. 2A to 2L schematically illustrate the steps of a manufacturing method for a nonvolatile charge-trapping memory apparatus according to a second embodiment of the present invention;

FIGS. 3A to 3C schematically illustrate some steps of a variant example of the manufacturing method according to the second embodiment of the present invention;

FIGS. 4A to 4C schematically illustrate some steps of another variant example of the manufacturing method according to the second embodiment of the present invention;

FIGS. 5A to 5F schematically illustrate the steps of a manufacturing method for a nonvolatile charge-trapping memory apparatus according to a third embodiment of the present invention;

FIGS. 6A to 6L schematically illustrate the steps of a manufacturing method for a nonvolatile charge-trapping memory apparatus according to a fourth embodiment of the present invention; and FIGS. 7A to 7F schematically illustrate the steps of a manufacturing method for a nonvolatile charge-trapping memory apparatus according to a fifth embodiment of the present invention.

DETAILED DESCRIPTION OF PREFERRED EMBODIMENTS

The present invention provides a manufacturing method for a nonvolatile memory apparatus. By using the manufacturing method of the present invention, core devices, IO devices, switching devices and storage devices can be fabricated on the same semiconductor substrate.

That is, after the manufacturing method of the present invention is completed, the devices required to form a peripheral circuit and a memory cell array are fabricated on the same semiconductor substrate. Consequently, the nonvolatile memory apparatus with the peripheral circuit and the memory cell array is manufactured. The memory cells produced by the manufacturing method of the present invention are nonvolatile charge-trapping memory cells. Consequently, the nonvolatile memory apparatus of the present invention is also referred to as a nonvolatile charge-trapping memory apparatus.

FIGS. 1A to 1I schematically illustrate the steps of a manufacturing method for a nonvolatile charge-trapping memory apparatus according to a first embodiment of the present invention.

Figure 1A:
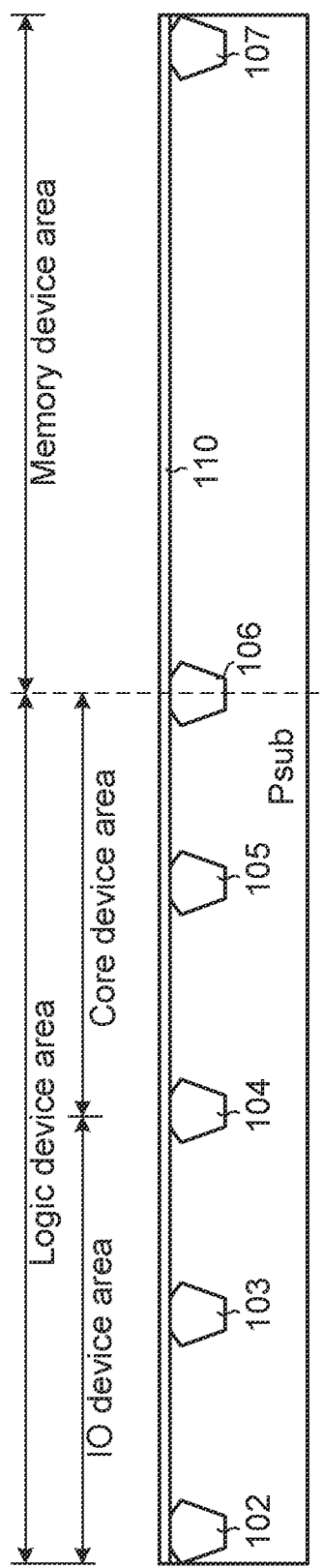
FIGS. 1A to 1I schematically illustrate the steps of a manufacturing method for a nonvolatile charge-trapping memory apparatus according to a first embodiment of the present invention.

As shown in FIG. 1A, an isolation structure formation process is performed. Firstly, a pad oxide layer 110 is formed on a surface of a semiconductor substrate Psub, and plural isolation structures 102~107 are formed in the semiconductor substrate Psub. For example, the semiconductor substrate Psub is a P-type substrate, and the isolation structures 102~107 are shallow trench isolation (STI) structures.

For example, when the isolation structure formation process is performed, the pad oxide layer 110 and a pad silicon nitride layer (not shown) are sequentially formed on the surface of the semiconductor substrate Psub. After the plural isolation structures 102~107 are formed in semiconductor substrate Psub, an etching process is performed to remove the pad silicon nitride layer. Consequently, only the pad oxide layer 110 is formed on the surface of the semiconductor substrate Psub.

Please refer to FIG. 1A again. On the surface of the semiconductor substrate Psub, the region between the isolation structure 102 and the isolation structure 106 is a logic device area, and the region between the isolation structure 106 and the isolation structure 107 is a memory device area. The devices in the logic device area are collaboratively formed as a peripheral circuit of the nonvolatile memory apparatus. The devices in the memory device area are collaboratively formed as a memory cell array of the nonvolatile memory apparatus. That is, the nonvolatile memory cells composed of switching devices and storage devices are constructed in the memory device area.

Moreover, the logic device area is divided into an input/output device area (or an IO device area) and a core device area. As shown in FIG. 1A, the region between the isolation structure 102 and the isolation structure 104 is the IO device area, and the region between the isolation structure 104 and the isolation structure 106 is the core device area. The IO devices include HV P-type transistors and HV N-type transistors. The core devices include LV P-type transistors and LV N-type transistors.

In this embodiment, an HV N-type transistor will be formed in the region between the isolation structure 102 and the isolation structure 103, an HV P-type transistor will be formed in the region between the isolation structure 103 and the isolation structure 104, an LV N-type transistor will be formed in the region between the isolation structure 104 and the isolation structure 105, and an LV P-type transistor will be formed in the region between the isolation structure 105 and the isolation structure 106.

Figure 1B:
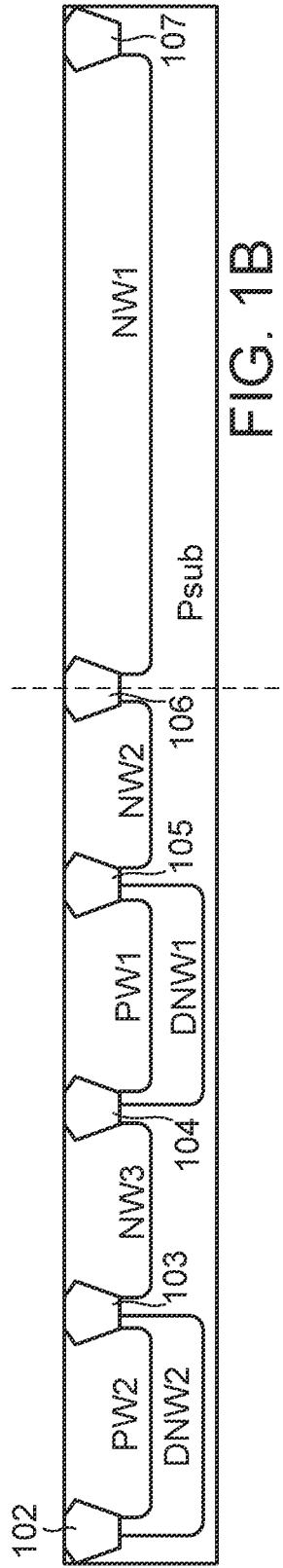

Please refer to FIG. 1B. Then, plural ion implantation processes are performed. Consequently, an N-well region NW1 is formed under the surface of the semiconductor substrate Psub and in the memory device area, and N-well regions NW2, NW3, P-well regions PW1, PW2 and deep N-well regions DNW1, DNW2 are formed under the surface of the semiconductor substrate Psub and in the logic device area. Then, an etching process is performed to remove the pad oxide layer 110.

Please refer to FIG. 1B again. The N-well region NW1 is formed under the surface of the semiconductor substrate Psub and arranged between the isolation structure 106 and the isolation structure 107. The N-well region NW2 is formed under the surface of the semiconductor substrate Psub and arranged between the isolation structure 105 and the isolation structure 106. The P-well region PW1 and the deep N-well region DNW1 are formed under the surface of the semiconductor substrate Psub and arranged between the isolation structure 104 and the isolation structure 105. In addition, the P-well region PW1 is formed in the deep N-well region DNW1. The N-well region NW3 is formed under the surface of the semiconductor substrate Psub and arranged between the isolation structure 103 and the isolation structure 104. The P-well region PW2 and the deep N-well region DNW2 are formed under the surface of the semiconductor substrate Psub and arranged between the isolation structure 102 and the isolation structure 103. In addition, the P-well region PW2 is formed in the deep N-well region DNW2.

Figure 1C:
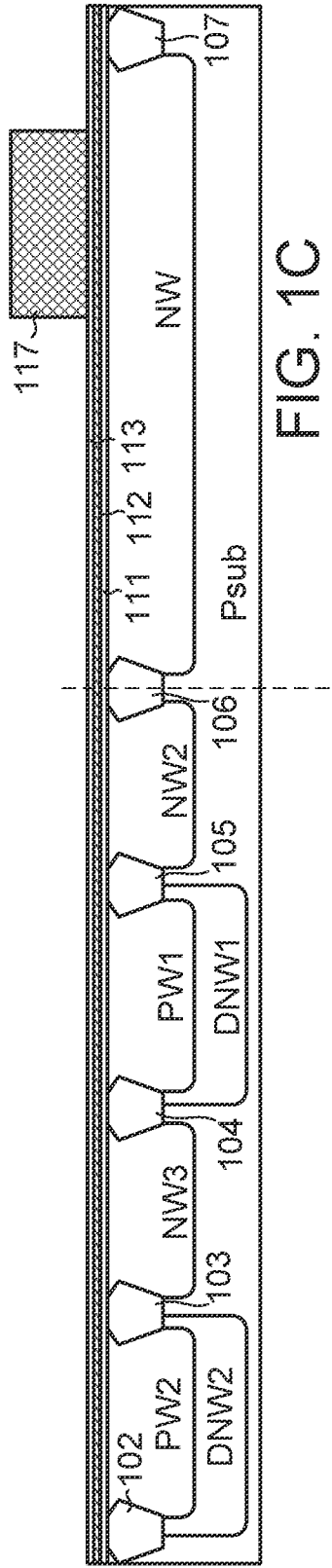

Please refer to FIG. 1C. Then, a stack layer is formed on the surface of the semiconductor substrate Psub. The stack layer comprises a bottom oxide layer 111, a trapping layer 112 and a blocking layer 113. Then, a photoresist layer 117 is formed in the memory device area to cover a portion of the stack layer. For example, the trapping layer 112 is made of silicon nitride, and the bottom oxide layer 111 and the blocking layer 113 are made of silicon oxide.

Figure 1D:
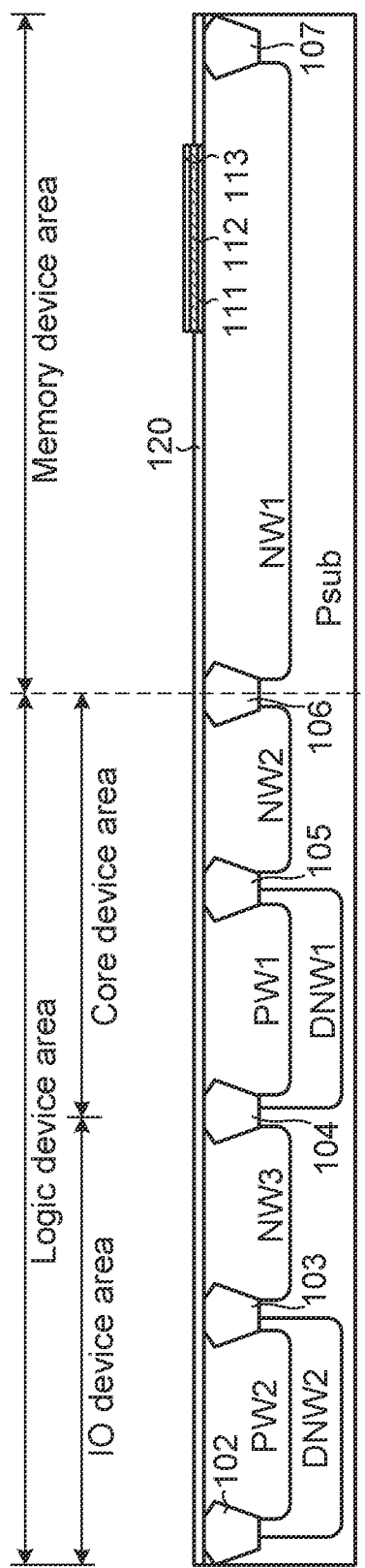

Please refer to FIG. 1D. Then, an etching process is performed. Consequently, the portions of the bottom oxide layer 111, the trapping layer 112 and the blocking layer 113 uncovered by the photoresist layer 117 are removed. After the photoresist layer 117 is removed, an IO gate oxide layer 120 is formed on the exposed surface of the semiconductor substrate Psub.

Figure 1E:
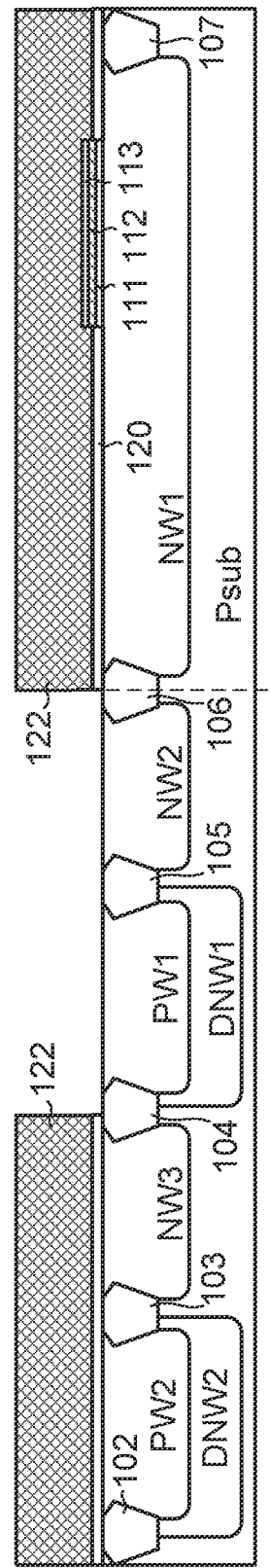

Please refer to FIG. 1E. Then, a photoresist layer 122 is provided to cover the memory device area and the IO device area. Then, an etching process is performed. Consequently, the portion of the IO gate oxide layer 120 on the surface of the semiconductor substrate Psub and in the core device area is removed.

Figure 1F:
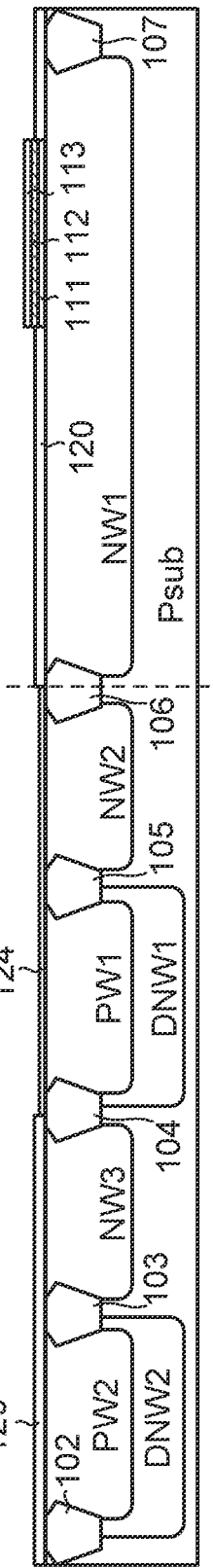

Please refer to FIG. 1F. Then, the photoresist layer 122 is removed, and a core gate oxide layer 124 is formed on the surface of the semiconductor substrate Psub and in the core device area. The thickness of the core gate oxide layer 124 is smaller than the thickness of the IO gate oxide layer 120.

Then, a gate structure formation process and plural doping processes will be performed. The gate structure formation process and the doping processes are compatible with the standard CMOS manufacturing process. The reasons will be briefly described as follows.

Figure 1G:
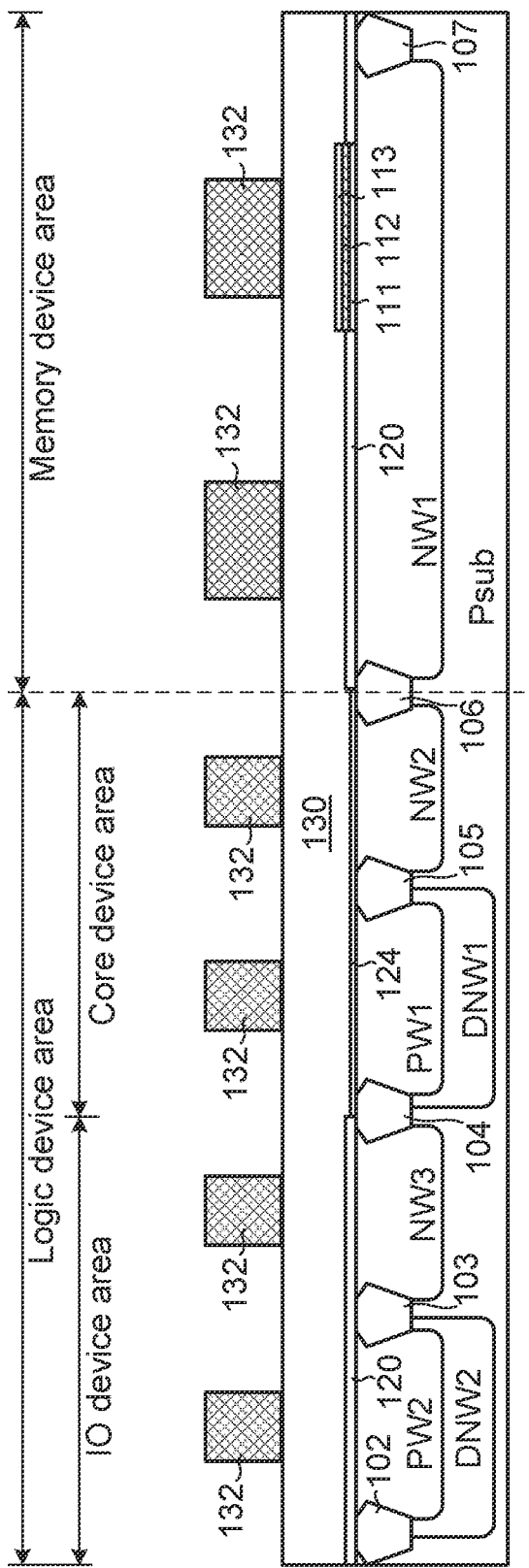

Please refer to FIG. 1G. Then, a gate layer 130 is formed to cover the logic device area and the memory device area. That is, the IO gate oxide layer 120, the core gate oxide layer 124 and the blocking layer 113 are covered by the gate layer 130. Then, a photoresist layer 132 is formed on the gate layer 130. For example, the gate layer 130 is made of polysilicon.

Figure 1H:
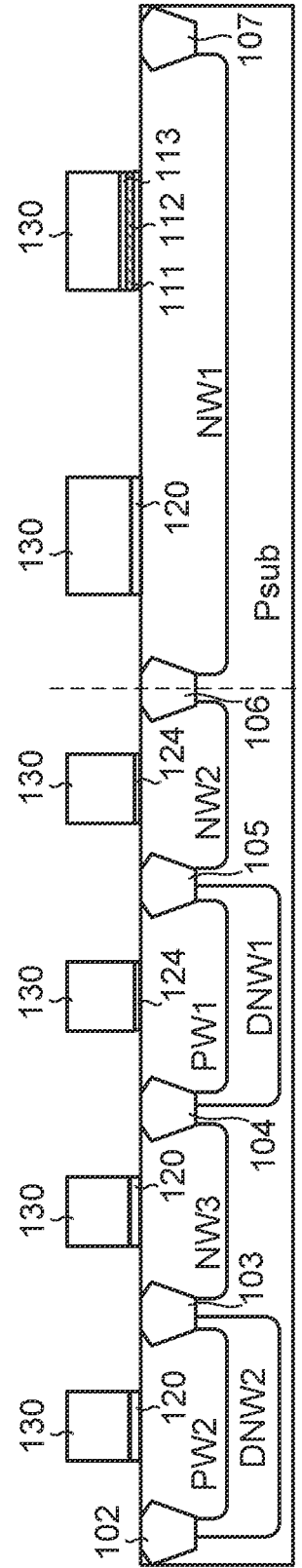
Figure 1:
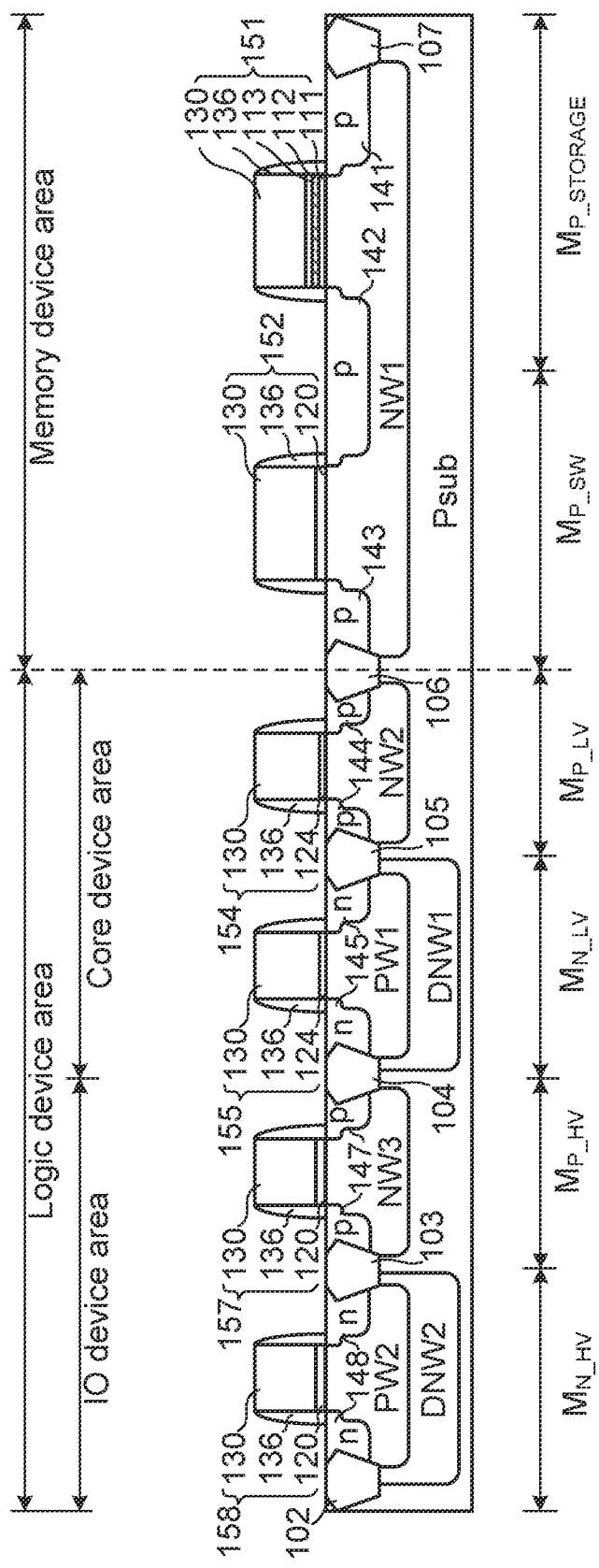

Please refer to FIG. 1H. Then, an etching process is performed. Consequently, the portions of the gate layer 130, the IO gate oxide layer 120, the core gate oxide layer 124, the bottom oxide layer 111, the trapping layer 112 and the blocking layer 113 uncovered by the photoresist layer 132 are removed. Then, the photoresist layer 132 is removed.

Please refer to FIG. 1I. Then, in the IO device area, a spacer 136 is formed on the sidewalls of the IO gate oxide layer 120 and the gate layer 130. Consequently, the gate structures 157 and 158 of two IO devices are defined by the IO gate oxide layer 120, the gate layer 130 and the spacer 136 collaboratively.

Similarly, in the core device area, the spacer 136 is formed on the sidewalls of the core gate oxide layer 124 and the gate layer 130. Consequently, the gate structures 154 and 155 of two core devices are defined by the core gate oxide layer 124, the gate layer 130 and the spacer 136 collaboratively.

Similarly, in the memory device area, the spacer 136 is formed on the sidewalls of the IO gate oxide layer 120 and the gate layer 130, and the spacer 136 is formed on the sidewalls of the bottom oxide layer 111, the trapping layer 112, the blocking layer 113 and the gate layer 130. Consequently, a gate structure 152 of a switching device is defined by the IO gate oxide layer 120, the gate layer 130 and the spacer 136 collaboratively, and a gate structure 151 of a storage device is defined by the bottom oxide layer 111, the trapping layer 112, the blocking layer 113, the gate layer 130 and the spacer 136 collaboratively.

Then, the doping processes are performed. In the IO device area, the gate structure 158 is formed over the P-well region PW2, and two n-doped regions 148 are formed in the P-well region PW2 and located beside two sides of the gate structure 158. Consequently, the P-well region PW2, the two n-doped regions 148 and the gate structure 158 are collaboratively formed as an HV N-type transistor $M_{N\_HV}$. Moreover, the gate structure 157 is formed over the N-well region NW3, and two p-doped regions 147 are formed in the N-well region NW3 and located beside two sides of the gate structure 157. Consequently, the N-well region NW3, the two p-doped regions 147 and the gate structure 157 are collaboratively formed as an HV P-type transistor $M_{P\_HV}$.

In the core device area, the gate structure 155 is formed over the P-well region PW1, and two n-doped regions 145 are formed in the P-well region PW1 and located beside two sides of the gate structure 155. Consequently, the P-well region PW1, the two n-doped regions 145 and the gate structure 155 are collaboratively formed as an LV N-type transistor $M_{N\_LV}$. Moreover, the gate structure 154 is formed over the N-well region NW2, and two p-doped regions 144 are formed in the N-well region NW2 and located beside two sides of the gate structure 154. Consequently, the N-well region NW2, the two p-doped regions 144 and the gate structure 154 are collaboratively formed as an LV P-type transistor $M_{P\_LV}$.

In the memory device area, the gate structure 152 is formed over the N-well region NW1, and two p-doped regions 142, 143 are formed in the N-well region NW1 and located beside two sides of the gate structure 152. Consequently, the N-well region NW1, the two p-doped regions 142, 143 and the gate structure 152 are collaboratively formed as a switching device $M_{P\_SW}$. Moreover, the gate structure 151 is formed over the N-well region NW1, and two p-doped regions 141, 142 are formed in the N-well region NW1 and located beside two sides of the gate structure 151. Consequently, the N-well region NW1, the two p-doped regions 141, 142 and the gate structure 151 are collaboratively formed as a storage device $M_{P\_STORAGE}$.

Optionally, the above-mentioned doping process further comprises a lightly doped drain process (also referred as an LDD process) and/or a halo implantation process. That is, each of the doped regions 141~148 is selectively equipped with an LDD region and/or a halo region. Moreover, in another embodiment, the positions of the two gate structures 151 and 152 in the memory device area may be interchanged. For example, gate structure 151 of the storage device is located between the two p-doped regions 142 and 143, and gate structure 152 of the switching device is located between the two p-doped regions 141 and 142.

In a subsequent step, a conducting line process is performed. Consequently, in the logic device area, the core devices (e.g., the LV P-type transistor $M_{P\_LV}$ and the LV N-type transistor $M_{N\_LV}$) and the IO devices (e.g., the HV P-type transistor $M_{P\_HV}$ and the HV N-type transistor $M_{N\_HV}$) are connected with each other and collaboratively formed as the peripheral circuit of the nonvolatile memory apparatus. Similarly, in the memory device area, the switching device $M_{P\_SW}$ and the storage device $M_{P\_STORAGE}$ are connected with each other and collaboratively formed as the memory cell array of the nonvolatile memory apparatus.

In the first embodiment, the gate structure 151 of the storage device $M_{P\_STORAGE}$ comprises the bottom oxide layer 111, the trapping layer 112 and the blocking layer 113. The bottom oxide layer 111 and the blocking layer 113 are made of silicon oxide. The trapping layer 112 is made of silicon nitride. Consequently, the gate structure 151 is an oxide/nitride/oxide (ONO) gate structure, and the storage device $M_{P\_STORAGE}$ is a charge trapping transistor with the ONO gate structure. In other words, the switching device $M_{P\_SW}$ and the storage device $M_{P\_STORAGE}$ are collaboratively formed as a nonvolatile charge-trapping memory cell, and the nonvolatile memory apparatus is a nonvolatile charge-trapping memory apparatus.

However, the manufacturing method of the first embodiment still has some drawbacks. For example, during the process of manufacturing the nonvolatile memory apparatus, the characteristics of the nonvolatile charge-trapping memory cell are possibly deteriorated. The reasons will be described as follows.

For example, as mentioned above, the gate structure 151 of the storage device $M_{P\_STORAGE}$ is the ONO gate structure. As shown in FIG. 1C and FIG. 1E, in the process of fabricating the storage device $M_{P\_STORAGE}$, the photoresist layers 117 and 122 are sequentially formed on the surface of the blocking layer 113. During the processes of removing the photoresist layers 117 and 122 and during the cleaning processes, the surface of the blocking layer 113 is possibly contaminated by particles, or the blocking layer 113 is eroded and thinned. Consequently, the characteristics of the storage device $M_{P\_STORAGE}$ are deteriorated.

Furthermore, as shown in FIG. 1B, the logic device area and the memory device area are simultaneously subjected to the ion implantation processes, and the three N-well regions NW1, NW2 and NW3 are formed under the surface of the semiconductor substrate Psub and in the logic device area and the memory device area. Since the memory device area cannot be subjected to the ion implantation process individually, the threshold voltage of the storage device $M_{P\_STORAGE}$ (i.e., the charge trapping transistor) is possibly shifted and unable to be precisely controlled. Moreover, since the logic device area and the memory device area are simultaneously subjected to the ion implantation processes, the limitation of the process rule makes it is difficult to further reduce the size of the nonvolatile memory cell.

For overcoming the above drawbacks, the manufacturing process of the first embodiment needs to be modified. For example, a protecting layer is formed over the blocking layer. Since the blocking layer is protected by the protecting layer, the blocking layer will not be contaminated or thinned during the manufacturing process. Moreover, in case that different ion implantation processes are provided to form the well regions in the memory device area and the well regions in the logic device area, the size of the nonvolatile memory cell can be reduced.

FIGS. 2A to 2L schematically illustrate the steps of a manufacturing method for a nonvolatile charge-trapping memory apparatus according to a second embodiment of the present invention.

Figure 2A:
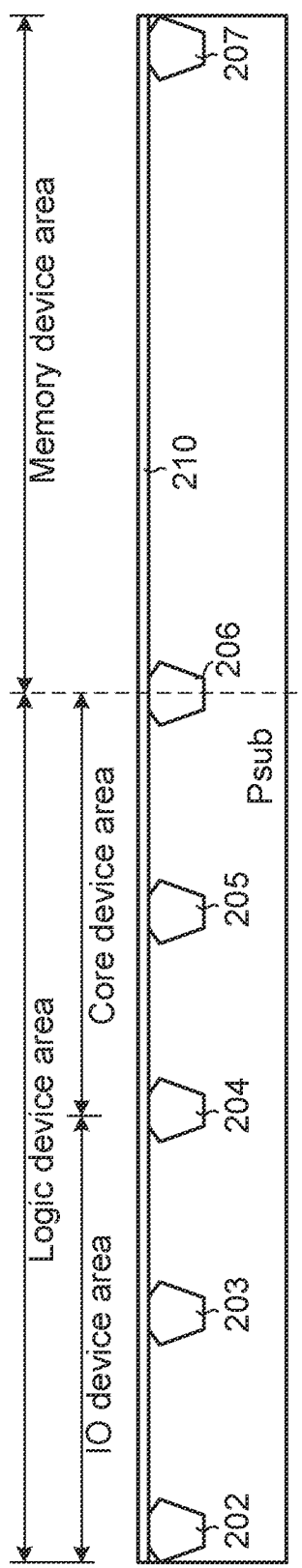

As shown in FIG. 2A, an isolation structure formation process is performed. Firstly, a pad oxide layer 210 is formed on a surface of a semiconductor substrate Psub, and plural isolation structures 202~207 are formed in the semiconductor substrate Psub. For example, the semiconductor substrate Psub is a P-type substrate, and the isolation structures 202~207 are shallow trench isolation (STI) structures.

Please refer to FIG. 2A again. On the surface of the semiconductor substrate Psub, the region between the isolation structure 202 and the isolation structure 206 is a logic device area, and the region between the isolation structure 206 and the isolation structure 207 is a memory device area. Moreover, the logic device area is divided into an input/output device area (or an IO device area) and a core device area. As shown in FIG. 2A, the region between the isolation structure 202 and the isolation structure 204 is the IO device area, and the region between the isolation structure 204 and the isolation structure 206 is the core device area.

In this embodiment, an HV N-type transistor will be formed in the region between the isolation structure 202 and the isolation structure 203, an HV P-type transistor will be formed in the region between the isolation structure 203 and the isolation structure 204, an LV N-type transistor will be formed in the region between the isolation structure 204 and the isolation structure 205, and an LV P-type transistor will be formed in the region between the isolation structure 205 and the isolation structure 206.

Figure 2B:
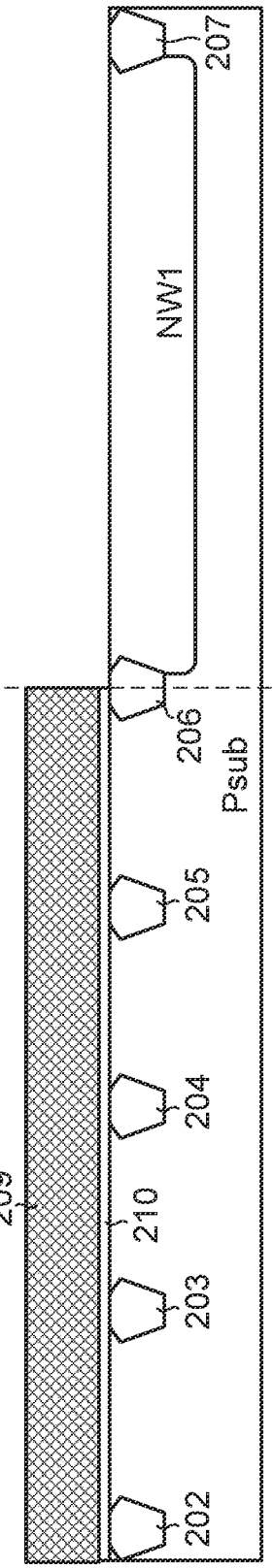

Please refer to FIG. 2B. Then, a photoresist layer 209 is formed to cover the logic device area. Then, an ion implantation process is performed. Consequently, an N-well region NW1 is formed under the surface of the semiconductor substrate Psub and in the memory device area. Then, an etching process is performed to remove the pad oxide layer 210 in the memory device area. Since the pad oxide layer 210 in the logic device area is covered by the photoresist layer 212, the pad oxide layer 210 in the logic device area is remained.

Figure 2C:
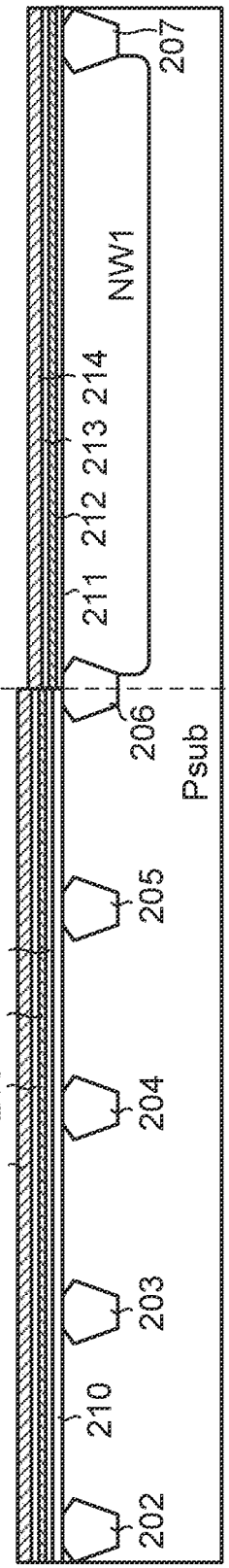

Please refer to FIG. 2C. After the photoresist layer 209 is removed, a stack layer is formed. The stack layer comprises a bottom oxide layer 211, a trapping layer 212, a blocking layer 213 and a protecting layer 214. The trapping layer 212 and the protecting layer 214 are made of silicon nitride. The bottom oxide layer 211 and the blocking layer 213 are made of silicon oxide.

As shown in FIG. 2C, the surface of the semiconductor substrate Psub in the memory device area is covered by the stack layer, and the pad oxide layer 210 in the logic device area is covered by the stack layer. That is, in the memory device area, the bottom oxide layer 211, the trapping layer 212, the blocking layer 213 and the protecting layer 214 are sequentially formed on the surface of the semiconductor substrate Psub. Whereas, in the logic device area, the pad oxide layer 210, the bottom oxide layer 211, the trapping layer 212, the blocking layer 213 and the protecting layer 214 are sequentially formed on the surface of the semiconductor substrate Psub.

Please refer to FIG. 2D. Then, a photoresist layer 217 is formed to cover a portion of the stack layer in the memory device area. After an etching process is performed, the portions of the trapping layer 212, the blocking layer 213 and the protecting layer 214 uncovered by the photoresist layer 217 are removed, and only the bottom oxide layer 211 is remained.

Please refer FIG. 2E. After the photoresist layer 217 is removed, a photoresist layer 218 is formed to cover the memory device area. Then, plural ion implantation processes are performed. Consequently, N-well regions NW2, NW3, P-well regions PW1, PW2 and deep N-well regions DNW1, DNW2 are formed under the surface of the semiconductor substrate Psub and in the logic device area. In addition, the P-well region PW1 is formed in the deep N-well region DNW1, and the P-well region PW2 is formed in the deep N-well region DNW2.

Please refer to FIG. 2E again. The N-well region NW2 is formed under the surface of the semiconductor substrate Psub and arranged between the isolation structure 205 and the isolation structure 206. The P-well region PW1 and the deep N-well region DNW1 are formed under the surface of the semiconductor substrate Psub and arranged between the isolation structure 204 and the isolation structure 205. In addition, the P-well region PW1 is formed in the deep N-well region DNW1. The N-well region NW3 is formed under the surface of the semiconductor substrate Psub and arranged between the isolation structure 203 and the isolation structure 204. The P-well region PW2 and the deep N-well region DNW2 are formed under the surface of the semiconductor substrate Psub and arranged between the isolation structure 202 and the isolation structure 203. In addition, the P-well region PW2 is formed in the deep N-well region DNW2.

In this embodiment, the N-well region NW1 in the memory device area is formed firstly, and then the N-well regions NW2 and NW3 in the logic device area are formed. In other words, the N-well region NW1 in the memory device area and the N-well regions NW2 and NW3 in the logic device area are not formed simultaneously. Further, even if the stack layer is formed at high temperature, the N-well regions NW2 and NW3 in the logic device area formed after the stack layer are not affected by the high temperature.

Please refer to FIG. 2F. Then, the photoresist layer 218 is removed. After an etching process is performed, the portions of the bottom oxide layer 211 and the pad oxide layer 210 uncovered by the stack layer are removed.

Please refer to FIG. 2G. Then, the protecting layer 214 in the memory device area is removed. Then, an IO gate oxide layer 220 is formed on the surface of the semiconductor substrate Psub.

Please refer to FIG. 2H. Then, a photoresist layer 222 is formed to cover the memory device area and the IO device area. After an etching process is performed, the portion of the IO gate oxide layer 220 on the surface of the semiconductor substrate Psub and in the core device area is removed.

Please refer to FIG. 2I. Then, the photoresist layer 222 is removed, and a core gate oxide layer 224 is formed on the surface of the semiconductor substrate Psub and in the core device area. The thickness of the core gate oxide layer 224 is smaller than the thickness of the IO gate oxide layer 220.

Then, a gate structure formation process and plural doping processes will be performed.

Figure 2J:
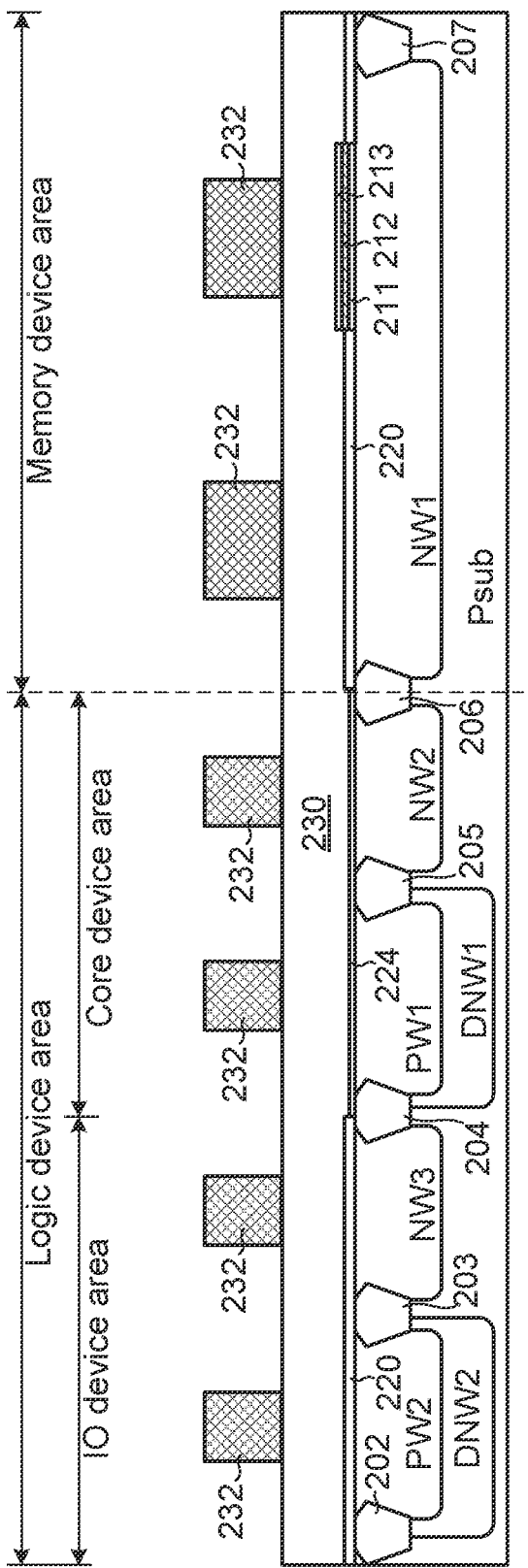

Please refer to FIG. 2J. Then, a gate layer 230 is formed to cover the logic device area and the memory device area. That is, the IO gate oxide layer 220, the core gate oxide layer 224 and the blocking layer 213 are covered by the gate layer 230. Then, a photoresist layer 232 is formed on the gate layer 230. For example, the gate layer is made of polysilicon.

Figure 2K:
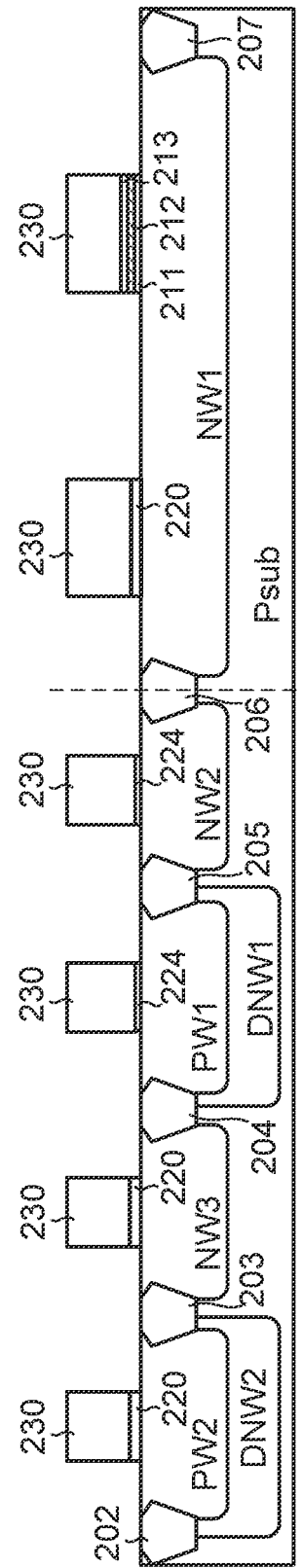

Please refer to FIG. 2K. Then, an etching process is performed. Consequently, the portions of the gate layer 230, the IO gate oxide layer 220, the core gate oxide layer 224, the bottom oxide layer 211, the trapping layer 212 and the blocking layer 213 uncovered by the photoresist layer 232 are removed. Then, the photoresist layer 232 is removed.

Figure 2L:
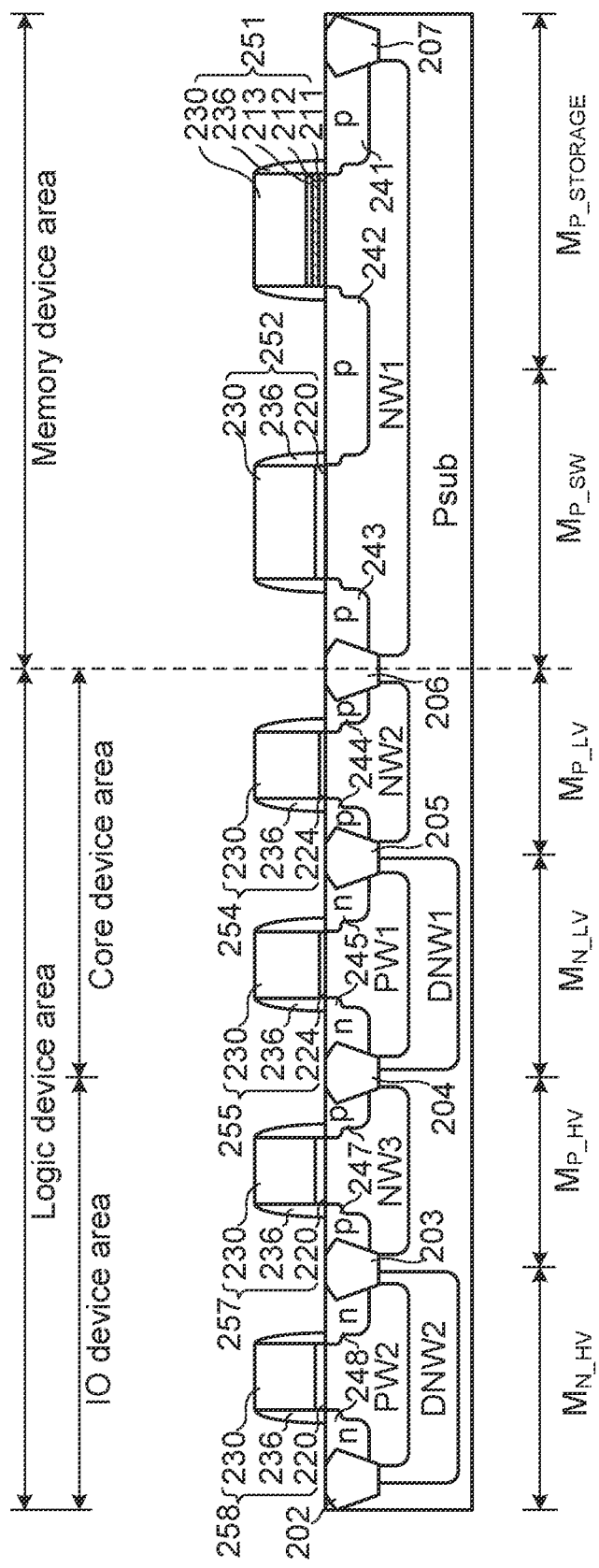

Please refer to FIG. 2L. Then, in the IO device area, a spacer 236 is formed on the sidewalls of the IO gate oxide layer 220 and the gate layer 230. Consequently, the gate structures 257 and 258 of two IO devices are defined by the IO gate oxide layer 220, the gate layer 230 and the spacer 236 collaboratively.

Similarly, in the core device area, the spacer 236 is formed on the sidewalls of the core gate oxide layer 224 and the gate layer 230. Consequently, the gate structures 254 and 255 of two core devices are defined by the core gate oxide layer 224, the gate layer 230 and the spacer 236 collaboratively.

Similarly, in the memory device area, the spacer 236 is formed on the sidewalls of the IO gate oxide layer 220 and the gate layer 230, and the spacer 236 is formed on the sidewalls of the bottom oxide layer 211, the trapping layer 212, the blocking layer 213 and the gate layer 230. Consequently, a gate structure 252 of a switching device is defined by the IO gate oxide layer 220, the gate layer 230 and the spacer 236 collaboratively, and a gate structure 251 of a storage device is defined by the bottom oxide layer 211, the trapping layer 212, the blocking layer 213, the gate layer 230 and the spacer 236 collaboratively.

Then, the doping processes are performed. In the IO device area, the gate structure 258 is formed over the P-well region PW2, and two n-doped regions 248 are formed in the P-well region PW2 and located beside two sides of the gate structure 258. Consequently, the P-well region PW2, the two n-doped regions 248 and the gate structure 258 are collaboratively formed as an HV N-type transistor $M_{N\_HV}$. Moreover, the gate structure 257 is formed over the N-well region NW3, and two p-doped regions 247 are formed in the N-well region NW3 and located beside two sides of the gate structure 257. Consequently, the N-well region NW3, the two p-doped regions 247 and the gate structure 257 are collaboratively formed as an HV P-type transistor $M_{P\_HV}$.

In the core device area, the gate structure 255 is formed over the P-well region PW2, and two n-doped regions 245 are formed in the P-well region PW2 and located beside two sides of the gate structure 255. Consequently, the P-well region PW2, the two n-doped regions 245 and the gate structure 255 are collaboratively formed as an LV N-type transistor $M_{N\_LV}$. Moreover, the gate structure 254 is formed over the N-well region NW2, and two p-doped regions 244 are formed in the N-well region NW2 and located beside two sides of the gate structure 254. Consequently, the N-well region NW2, the two p-doped regions 244 and the gate structure 254 are collaboratively formed as an LV P-type transistor $M_{P\_LV}$.

In the memory device area, the gate structure 252 is formed over the N-well region NW1, and two p-doped regions 242, 243 are formed in the N-well region NW1 and located beside two sides of the gate structure 252. Consequently, the N-well region NW1, the two p-doped regions 242, 243 and the gate structure 252 are collaboratively formed as a switching device $M_{P\_SW}$. Moreover, the gate structure 251 is formed over the N-well region NW1, and two p-doped regions 241, 242 are formed in the N-well region NW1 and located beside two sides of the gate structure 251. Consequently, the N-well region NW1, the two p-doped regions 241, 242 and the gate structure 251 are collaboratively formed as a storage device $M_{P\_STORAGE}$.

Optionally, the above-mentioned doping process further comprises a lightly doped drain process (also referred as an LDD process) and/or a halo implantation process. That is, each of the doped regions 241~248 is selectively equipped with an LDD region and/or a halo region.

In a subsequent step, a conducting line process is performed. Consequently, in the logic device area, the core devices (e.g., the LV P-type transistor $M_{P\_LV}$ and the LV N-type transistor $M_{N\_LV}$) and the IO devices (e.g., the HV P-type transistor $M_{P\_HV}$ and the HV N-type transistor $M_{N\_HV}$) are connected with each other and collaboratively formed as the peripheral circuit of the nonvolatile memory apparatus. Similarly, in the memory device area, the switching device $M_{P\_SW}$ and the storage device $M_{P\_STORAGE}$ are connected with each other and collaboratively formed as the memory cell array of the nonvolatile memory apparatus.

In the second embodiment, the gate structure 251 of the storage device $M_{P\_STORAGE}$ comprises the bottom oxide layer 211, the trapping layer 212 and the blocking layer 213. The bottom oxide layer 211 and the blocking layer 213 are made of silicon oxide. The trapping layer 212 is made of silicon nitride. Consequently, the gate structure 251 is an oxide/nitride/oxide (ONO) gate structure, and the storage device $M_{P\_STORAGE}$ is a charge trapping transistor with the ONO gate structure. In other words, the switching device $M_{P\_SW}$ and the storage device $M_{P\_STORAGE}$ are collaboratively formed as a nonvolatile charge-trapping memory cell, and the nonvolatile memory apparatus is a nonvolatile charge-trapping memory apparatus.

Obviously, during the manufacturing process of the nonvolatile memory apparatus, the blocking layer 213 is covered by the protecting layer 214. Consequently, during the manufacturing process, the surface of the blocking layer 213 is not contaminated or thinned. Moreover, since the well regions of the logic device area and the memory device area are not simultaneously fabricated, it is feasible to fabricate small-sized nonvolatile memory cell in the memory device area and precisely control the threshold voltage of the charge trapping transistor.

It is noted that the manufacturing process of the second embodiment may be varied according to the practical requirements. For example, after the step as shown in FIG. 2F is completed, the sequence of the steps of FIGS. 2G, 2H and 2I may be varied. That is, the sequence of the step of removing the protecting layer 214, the step of forming the IO gate oxide layer 220 and the step of forming the core gate oxide layer 224 may be varied.

FIGS. 3A to 3C schematically illustrate some steps of a variant example of the manufacturing method according to the second embodiment of the present invention. In this variant example, the steps of FIGS. 2G, 2H and 2I in the manufacturing method of the second embodiment are modified. After the structure of FIG. 2F is produced, the following steps are performed. As shown in FIG. 3A, the IO gate oxide layer 220 is formed on the surface of the semiconductor substrate Psub. Then, as shown in FIG. 3B, the protecting layer 214 is removed, and the photoresist layer 222 is provided to cover the memory device area and the IO device area. Then, an etching process is performed. Consequently, the portion of the IO gate oxide layer 220 on the surface of the semiconductor substrate Psub and in the core device area is removed. Then, as shown in FIG. 3C, the photoresist layer 222 is removed, and the core gate oxide layer 224 is formed on the surface of the semiconductor substrate Psub and in the core device area. The structure as shown in FIG. 3C is similar to the structure as shown in FIG. 2I. The subsequent steps are similar to those as shown in FIGS. 2J, 2K and 2L, and not redundantly described herein.

FIGS. 4A to 4C schematically illustrate some steps of another variant example of the manufacturing method according to the second embodiment of the present invention. In this variant example, the steps of FIGS. 2G, 2H and 2I in the manufacturing method of the second embodiment are modified. After the structure of FIG. 2F is produced, the following steps are performed. As shown in FIG. 4A, the IO gate oxide layer 220 is formed on the surface of the semiconductor substrate Psub. Then, as shown in FIG. 4B, the photoresist layer 222 is provided to cover the memory device area and the IO device area. Then, an etching process is performed. Consequently, the portion of the IO gate oxide layer 220 on the surface of the semiconductor substrate Psub and in the core device area is removed. Then, as shown in FIG. 4C, the photoresist layer 222 and the protecting layer 214 are removed, and the core gate oxide layer 224 is formed on the surface of the semiconductor substrate Psub and in the core device area. The subsequent steps are similar to those as shown in FIGS. 2J, 2K and 2L, and not redundantly described herein.

FIGS. 5A to 5F schematically illustrate the steps of a manufacturing method for a nonvolatile charge-trapping memory apparatus according to a third embodiment of the present invention.

As shown in FIG. 5A, an isolation structure formation process is performed. Firstly, a pad oxide layer 510 is formed on a surface of a semiconductor substrate Psub, and plural isolation structures 502~507 are formed in the semiconductor substrate Psub. For example, the semiconductor substrate Psub is a P-type substrate, and the isolation structures 502~507 are shallow trench isolation (STI) structures.

Please refer to FIG. 5A again. On the surface of the semiconductor substrate Psub, the region between the isolation structure 502 and the isolation structure 506 is a logic device area, and the region between the isolation structure 506 and the isolation structure 507 is a memory device area. Moreover, the logic device area is divided into an input/output device area (or an IO device area) and a core device area. As shown in FIG. 5A, the region between the isolation structure 502 and the isolation structure 504 is the IO device area, and the region between the isolation structure 504 and the isolation structure 506 is the core device area.

Please refer to FIG. 5B. Then, a photoresist layer 512 is formed to cover the logic device area. Then, an ion implantation process is performed. Consequently, an N-well region NW1 is formed under the surface of the semiconductor substrate Psub and in the memory device area. After the photoresist layer 512 is removed, the entire of the pad oxide layer 510 is removed.

Please refer to FIG. 5C. Then, a stack layer is formed on the surface of the semiconductor substrate Psub. The stack layer comprises a bottom oxide layer 511, a trapping layer 512, a blocking layer 513 and a protecting layer 514. The trapping layer 512 and the protecting layer 514 are made of silicon nitride. The bottom oxide layer 511 and the blocking layer 513 are made of silicon oxide. In other words, the bottom oxide layer 511, the trapping layer 512, the blocking layer 513 and the protecting layer 514 are sequentially formed on the surface of the semiconductor substrate Psub.

Figure 5D:
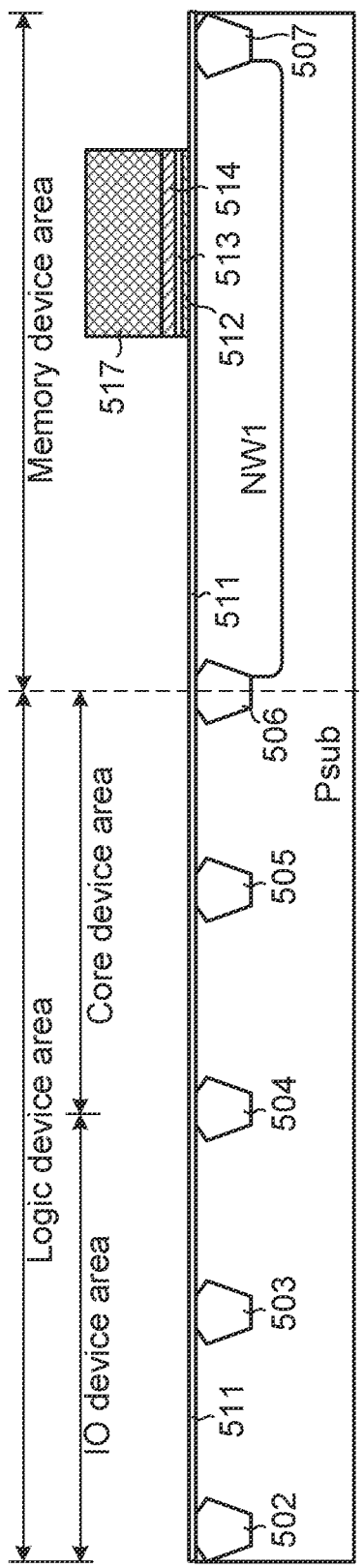

Please refer to FIG. 5D. Then, a photoresist layer 517 is formed to cover a portion of the stack layer in the memory device area. After an etching process is performed, the portions of the trapping layer 512, the blocking layer 513 and the protecting layer 514 uncovered by the photoresist layer 517 are removed, and only the bottom oxide layer 511 is remained.

Figure 5E:
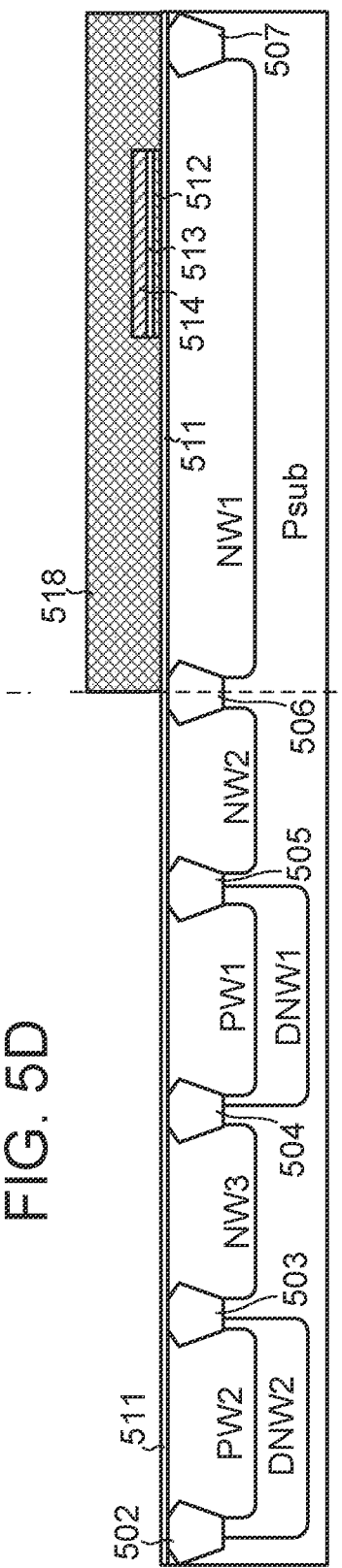

Please refer FIG. 5E. After the photoresist layer 517 is removed, a photoresist layer 518 is formed to cover the memory device area. Then, plural ion implantation processes are performed. Consequently, N-well regions NW2, NW3, P-well regions PW1, PW2 and deep N-well regions DNW1, DNW2 are formed under the surface of the semiconductor substrate Psub and in the logic device area. In addition, the P-well region PW1 is formed in the deep N-well region DNW1, and the P-well region PW2 is formed in the deep N-well region DNW2.

Please refer to FIG. 5E again. The N-well region NW2 is formed under the surface of the semiconductor substrate Psub and arranged between the isolation structure 505 and the isolation structure 506. The P-well region PW1 and the deep N-well region DNW1 are formed under the surface of the semiconductor substrate Psub and arranged between the isolation structure 504 and the isolation structure 505. In addition, the P-well region PW1 is formed in the deep N-well region DNW1. The N-well region NW3 is formed under the surface of the semiconductor substrate Psub and arranged between the isolation structure 503 and the isolation structure 504. The P-well region PW2 and the deep N-well region DNW2 are formed under the surface of the semiconductor substrate Psub and arranged between the isolation structure 502 and the isolation structure 503. In addition, the P-well region PW2 is formed in the deep N-well region DNW2.

In this embodiment, the N-well region NW1 in the memory device area is formed firstly, and then the N-well regions NW2 and NW3 in the logic device area are formed. In other words, the N-well region NW1 in the memory device area and the N-well regions NW2 and NW3 in the logic device area are not formed simultaneously.

Figure 5F:
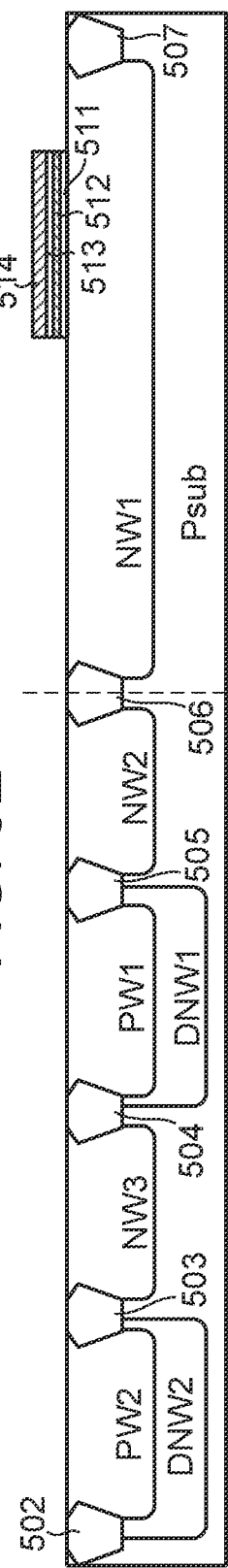

Please refer to FIG. 5F. Then, the photoresist layer 518 is removed. After an etching process is performed, the portion of the bottom oxide layer 511 uncovered by the stack layer is removed. The structure of FIG. 5F is identical to the structure of FIG. 2F. The subsequent steps are similar to those as shown in FIGS. 2G, 2H, 2I, 2J, 2K and 2L of the second embodiment, and not redundantly described herein.

Moreover, the manufacturing process of the third embodiment may be modified. For example, in a variant example, the steps of FIGS. 3A, 3B and 3C are performed. In another variant example, the steps of FIGS. 4A, 4B and 4C are performed.

In the first embodiment, the second embodiment and the third embodiment, the gate structure of the switching device switching device $M_{P\_SW}$ in the memory device area comprises the IO gate oxide layer, the gate layer and the spacer. For example, as shown in FIG. 2L, the gate structure 252 of the switching device $M_{P\_SW}$ comprises the IO gate oxide layer 220, the gate layer 230 and the spacer 236. In the following embodiments, the gate structure 252 of the switching device $M_{P\_SW}$ is made of other materials.

FIGS. 6A to 6L schematically illustrate the steps of a manufacturing method for a nonvolatile charge-trapping memory apparatus according to a fourth embodiment of the present invention.

As shown in FIG. 6A, an isolation structure formation process is performed. Firstly, a pad oxide layer 610 is formed on a surface of a semiconductor substrate Psub, and plural isolation structures 602~607 are formed in the semiconductor substrate Psub. For example, the semiconductor substrate Psub is a P-type substrate, and the isolation structures 602||607 are shallow trench isolation (STI) structures.

Please refer to FIG. 6A again. On the surface of the semiconductor substrate Psub, the region between the isolation structure 602 and the isolation structure 606 is a logic device area, and the region between the isolation structure 606 and the isolation structure 607 is a memory device area. Moreover, the logic device area is divided into an input/output device area (or an IO device area) and a core device area. As shown in FIG. 6A, the region between the isolation structure 602 and the isolation structure 604 is the IO device area, and the region between the isolation structure 604 and the isolation structure 606 is the core device area.

Please refer to FIG. 6B. Then, a photoresist layer 612 is formed to cover the logic device area. Then, an ion implantation process is performed. Consequently, an N-well region NW1 is formed under the surface of the semiconductor substrate Psub and in the memory device area. Then, an etching process is performed to remove the pad oxide layer 610 in the memory device area. Since the pad oxide layer 610 in the logic device area is covered by the photoresist layer 612, the pad oxide layer 610 in the logic device area is remained.

Please refer to FIG. 6C. After the photoresist layer 612 is removed, a stack layer is formed. The stack layer comprises a bottom oxide layer 611, a trapping layer 612, a blocking layer 613 and a protecting layer 614. The trapping layer 612 and the protecting layer 614 are made of silicon nitride. The bottom oxide layer 611 and the blocking layer 613 are made of silicon oxide.

As shown in FIG. 6C, the surface of the semiconductor substrate Psub in the memory device area is covered by the stack layer, and the pad oxide layer 610 in the logic device area is covered by the stack layer. That is, in the memory device area, the bottom oxide layer 611, the trapping layer 612, the blocking layer 613 and the protecting layer 614 are sequentially formed on the surface of the semiconductor substrate Psub. Whereas, in the logic device area, the pad oxide layer 610, the bottom oxide layer 611, the trapping layer 612, the blocking layer 613 and the protecting layer 614 are sequentially formed on the surface of the semiconductor substrate Psub.

Please refer to FIG. 6D. Then, a photoresist layer 617 is formed to cover a portion of the stack layer in the memory device area. After an etching process is performed, the portions of the trapping layer 612, the blocking layer 613 and the protecting layer 614 uncovered by the photoresist layer 617 are removed, and only the bottom oxide layer 611 is remained.

Please refer FIG. 6E. After the photoresist layer 617 is removed, a photoresist layer 618 is formed to cover the memory device area. Then, plural ion implantation processes are performed. Consequently, N-well regions NW2, NW3, P-well regions PW1, PW2 and deep N-well regions DNW1, DNW2 are formed under the surface of the semiconductor substrate Psub and in the logic device area. In addition, the P-well region PW1 is formed in the deep N-well region DNW1, and the P-well region PW2 is formed in the deep N-well region DNW2.

Please refer to FIG. 6E again. The N-well region NW2 is formed under the surface of the semiconductor substrate Psub and arranged between the isolation structure 605 and the isolation structure 606. The P-well region PW1 and the deep N-well region DNW1 are formed under the surface of the semiconductor substrate Psub and arranged between the isolation structure 604 and the isolation structure 605. In addition, the P-well region PW1 is formed in the deep N-well region DNW1. The N-well region NW3 is formed under the surface of the semiconductor substrate Psub and arranged between the isolation structure 603 and the isolation structure 604. The P-well region PW2 and the deep N-well region DNW2 are formed under the surface of the semiconductor substrate Psub and arranged between the isolation structure 602 and the isolation structure 603. In addition, the P-well region PW2 is formed in the deep N-well region DNW2.

In this embodiment, the N-well region NW1 in the memory device area is formed firstly, and then the N-well regions NW2 and NW3 in the logic device area are formed. In other words, the N-well region NW1 in the memory device area and the N-well regions NW2 and NW3 in the logic device area are not formed simultaneously.

Please refer to FIG. 6F. Then, the photoresist layer 618 is removed. After an etching process is performed, the portions of the bottom oxide layer 611 and the pad oxide layer 610 uncovered by the stack layer are removed.

Please refer to FIG. 6G. Then, the protecting layer 614 in the memory device area is removed. Then, an IO gate oxide layer 620 is formed on the surface of the semiconductor substrate Psub.

Please refer to FIG. 6H. Then, a photoresist layer 622 is formed to cover the IO device area and a portion of the blocking layer 613 in the memory device area. After an etching process is performed, the portion of the IO gate oxide layer 620 on the surface of the semiconductor substrate Psub and in the core device area is removed, and the portions of the blocking layer 613 and the IO gate oxide layer 620 in the memory device area and uncovered by the photoresist layer 622 are removed. In this embodiment, the photoresist layer 622 covers at least half of the stack layer in the memory device area.

Please refer to FIG. 6I. Then, the photoresist layer 622 is removed, and a core gate oxide layer 624 is formed on the surface of the semiconductor substrate Psub and in the core device area. The thickness of the core gate oxide layer 624 is smaller than the thickness of the IO gate oxide layer 620. Moreover, in the memory device area, a portion of the trapping layer 612 is covered by the blocking layer 613, and another portion of the trapping layer 612 is not covered by the blocking layer 613.

Then, a gate structure formation process and plural doping processes will be performed.

Figure 6J:
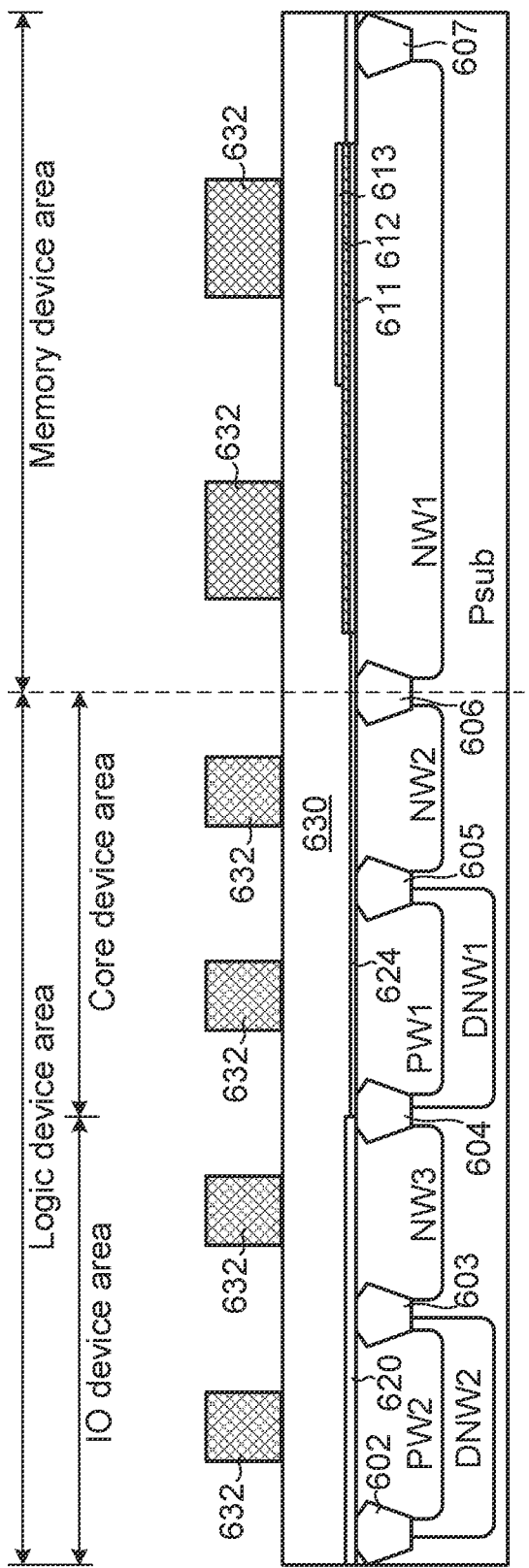

Please refer to FIG. 6J. Then, a gate layer 630 is formed to cover the logic device area and the memory device area. That is, the IO gate oxide layer 620, the core gate oxide layer 624, the trapping layer 612 and the blocking layer 613 are covered by the gate layer 630. Then, a photoresist layer 632 is formed on the gate layer 630. For example, the gate layer is made of polysilicon.

Figure 6K:
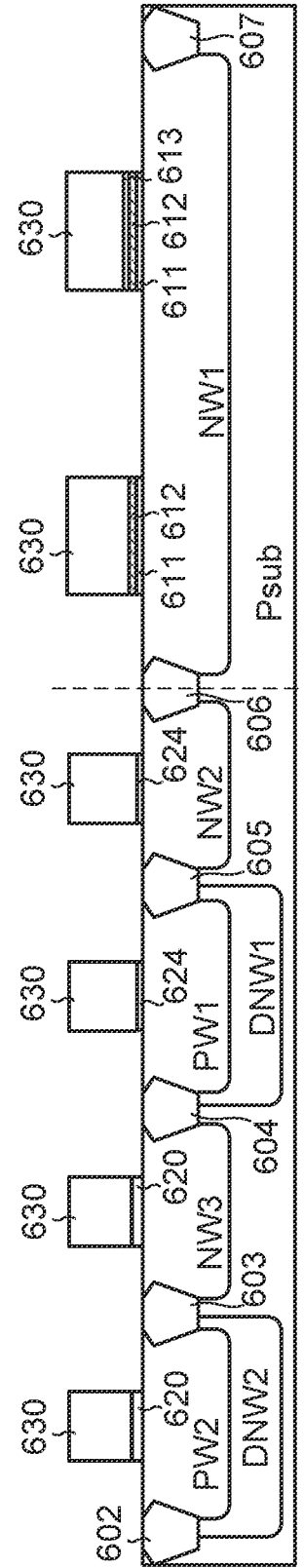

Please refer to FIG. 6K. Then, an etching process is performed. Consequently, the portions of the gate layer 630, the IO gate oxide layer 620, the core gate oxide layer 624, the bottom oxide layer 611, the trapping layer 612 and the blocking layer 613 uncovered by the photoresist layer 632 are removed. Then, the photoresist layer 632 is removed.

Figure 6L:
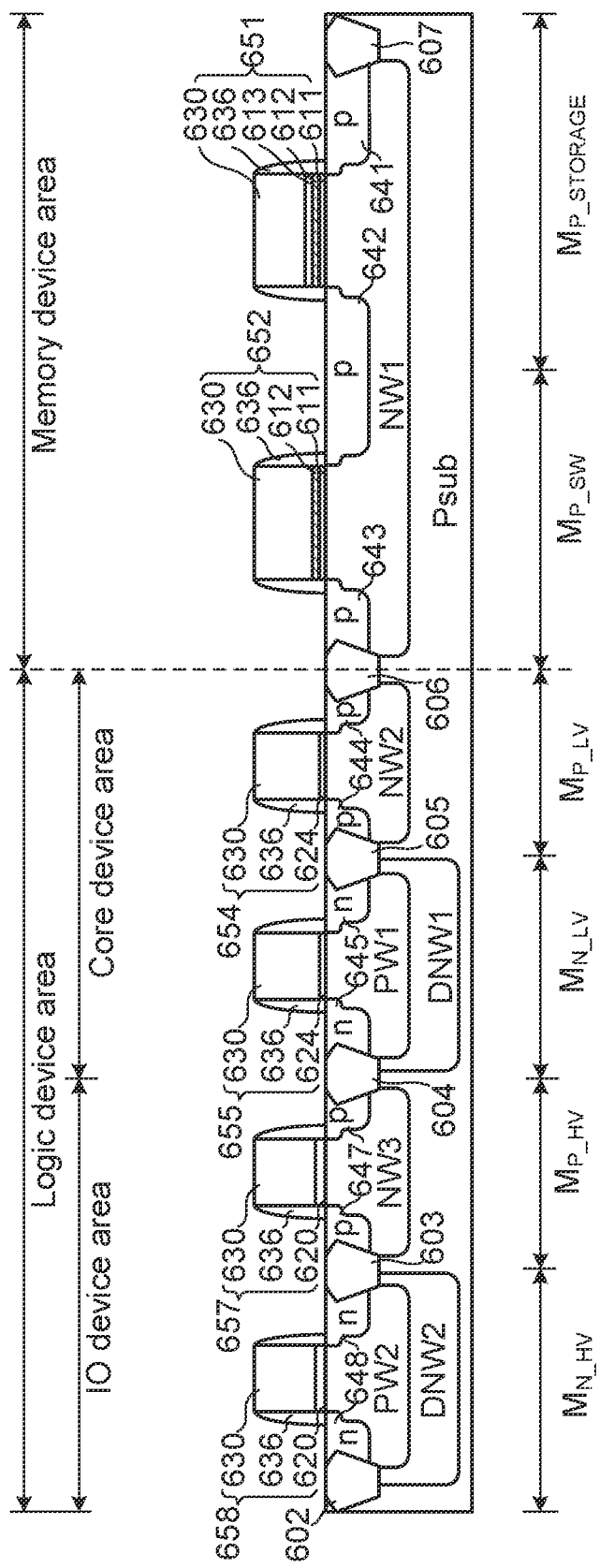

Please refer to FIG. 6L. Then, in the IO device area, a spacer 636 is formed on the sidewalls of the IO gate oxide layer 620 and the gate layer 630. Consequently, the gate structures 657 and 658 of two IO devices are defined by the IO gate oxide layer 620, the gate layer 630 and the spacer 636 collaboratively.

Similarly, in the core device area, the spacer 636 is formed on the sidewalls of the core gate oxide layer 624 and the gate layer 630. Consequently, the gate structures 654 and 655 of two core devices are defined by the core gate oxide layer 624, the gate layer 630 and the spacer 636 collaboratively.

Similarly, in the memory device area, the spacer 636 is formed on the sidewalls of the bottom oxide layer 611, the trapping layer 612 and the gate layer 630, and the spacer 636 is formed on the sidewalls of the bottom oxide layer 611, the trapping layer 612, the blocking layer 613 and the gate layer 630. Consequently, a gate structure 652 of a switching device is defined by the bottom oxide layer 611, the trapping layer 612, the gate layer 630 and the spacer 636 collaboratively, and a gate structure 651 of a storage device is defined by the bottom oxide layer 611, the trapping layer 612, the blocking layer 613, the gate layer 630 and the spacer 636 collaboratively.

Then, the doping processes are performed. In the IO device area, the gate structure 658 is formed over the P-well region PW2, and two n-doped regions 648 are formed in the P-well region PW2 and located beside two sides of the gate structure 658. Consequently, the P-well region PW2, the two n-doped regions 648 and the gate structure 658 are collaboratively formed as an HV N-type transistor $M_{N\_HV}$. Moreover, the gate structure 657 is formed over the N-well region NW3, and two p-doped regions 647 are formed in the N-well region NW3 and located beside two sides of the gate structure 657. Consequently, the N-well region NW3, the two p-doped regions 647 and the gate structure 657 are collaboratively formed as an HV P-type transistor $M_{P\_HV}$.

In the core device area, the gate structure 655 is formed over the P-well region PW2, and two n-doped regions 645 are formed in the P-well region PW2 and located beside two sides of the gate structure 655. Consequently, the P-well region PW2, the two n-doped regions 645 and the gate structure 655 are collaboratively formed as an LV N-type transistor $M_{N\_LV}$. Moreover, the gate structure 654 is formed over the N-well region NW2, and two p-doped regions 644 are formed in the N-well region NW2 and located beside two sides of the gate structure 654. Consequently, the N-well region NW2, the two p-doped regions 644 and the gate structure 654 are collaboratively formed as an LV P-type transistor $M_{P\_LV}$.

In the memory device area, the gate structure 652 is formed over the N-well region NW1, and two p-doped regions 642, 643 are formed in the N-well region NW1 and located beside two sides of the gate structure 652. Consequently, the N-well region NW1, the two p-doped regions 642, 643 and the gate structure 652 are collaboratively formed as a switching device $M_{P\_SW}$. Moreover, the gate structure 651 is formed over the N-well region NW1, and two p-doped regions 641, 642 are formed in the N-well region NW1 and located beside two sides of the gate structure 651. Consequently, the N-well region NW1, the two p-doped regions 641, 642 and the gate structure 651 are collaboratively formed as a storage device $M_{P\_STORAGE}$.

Optionally, the above-mentioned doping process further comprises a lightly doped drain process (also referred as an LDD process) and/or a halo implantation process. That is, each of the doped regions 641~648 is selectively equipped with an LDD region and/or a halo region.

In a subsequent step, a conducting line process is performed. Consequently, in the logic device area, the core devices (e.g., the LV P-type transistor $M_{P\_LV}$ and the LV N-type transistor $M_{N\_LV}$) and the IO devices (e.g., the HV P-type transistor $M_{P\_HV}$ and the HV N-type transistor $M_{N\_HV}$) are connected with each other and collaboratively formed as the peripheral circuit of the nonvolatile memory apparatus. Similarly, in the memory device area, the switching device $M_{P\_SW}$ and the storage device $M_{P\_STORAGE}$ are connected with each other and collaboratively formed as the memory cell array of the nonvolatile memory apparatus.

In comparison with the nonvolatile memory apparatus of the second embodiment of FIG. 2L, the gate structure of the switching device $M_{P\_SW}$ in the nonvolatile memory apparatus of the fourth embodiment of FIG. 6L is distinguished. The structures of the other embodiments of the fourth embodiments are identical to those of the second embodiment. In FIG. 2L, the gate structure 252 of the switching device $M_{P\_SW}$ comprises the IO gate oxide layer 220, the gate layer 230 and the spacer 236. In FIG. 6L, the gate structure 652 of the switching device $M_{P\_SW}$ comprises the bottom oxide layer 611, the trapping layer 612, the gate layer 630 and the spacer 636.

Similarly, during the manufacturing process of the nonvolatile memory apparatus, the blocking layer 613 is covered by the protecting layer 614. Consequently, during the manufacturing process, the surface of the blocking layer 613 is not contaminated or thinned. Moreover, since the well regions of the logic device area and the memory device area are not simultaneously fabricated, it is feasible to fabricate small-sized nonvolatile memory cell in the memory device area and precisely control the threshold voltage of the charge trapping transistor.

In the steps of FIG. 6F and FIG. 6G in the manufacturing process of the fourth embodiment, the protecting layer 614 is removed before the IO gate oxide layer 620 is formed. It is noted that the manufacturing process of the fourth embodiment may be varied according to the practical requirements. For example, the step of removing the protecting layer 614 and the step of forming the IO gate oxide layer 620 may be exchanged. For example, in a variant example, the protecting layer 614 is removed after the IO gate oxide layer 620 is formed.

FIGS. 7A to 7F schematically illustrate the steps of a manufacturing method for a nonvolatile charge-trapping memory apparatus according to a fifth embodiment of the present invention.

As shown in FIG. 7A, an isolation structure formation process is performed. Firstly, a pad oxide layer 710 is formed on a surface of a semiconductor substrate Psub, and plural isolation structures 702∥707 are formed in the semiconductor substrate Psub. For example, the semiconductor substrate Psub is a P-type substrate, and the isolation structures 702~707 are shallow trench isolation (STI) structures.

Please refer to FIG. 7A again. On the surface of the semiconductor substrate Psub, the region between the isolation structure 702 and the isolation structure 706 is a logic device area, and the region between the isolation structure 706 and the isolation structure 707 is a memory device area. Moreover, the logic device area is divided into an input/output device area (or an IO device area) and a core device area. As shown in FIG. 7A, the region between the isolation structure 702 and the isolation structure 704 is the IO device area, and the region between the isolation structure 704 and the isolation structure 706 is the core device area.

Please refer to FIG. 7B. Then, a photoresist layer 712 is formed to cover the logic device area. Then, an ion implantation process is performed. Consequently, an N-well region NW1 is formed under the surface of the semiconductor substrate Psub and in the memory device area. After the photoresist layer 712 is removed, the entire of the pad oxide layer 710 is removed.

Please refer to FIG. 7C. Then, a stack layer is formed on the surface of the semiconductor substrate Psub. The stack layer comprises a bottom oxide layer 711, a trapping layer 712, a blocking layer 713 and a protecting layer 714. The trapping layer 712 and the protecting layer 714 are made of silicon nitride. The bottom oxide layer 711 and the blocking layer 713 are made of silicon oxide. In other words, the bottom oxide layer 711, the trapping layer 712, the blocking layer 713 and the protecting layer 714 are sequentially formed on the surface of the semiconductor substrate Psub.

Please refer to FIG. 7D. Then, a photoresist layer 717 is formed to cover a portion of the protecting layer 714 of the stack layer in the memory device area. After an etching process is performed, the portions of the trapping layer 712, the blocking layer 713 and the protecting layer 714 uncovered by the photoresist layer 717 are removed, and only the bottom oxide layer 711 is remained.

Please refer FIG. 7E. After the photoresist layer 717 is removed, a photoresist layer 718 is formed to cover the memory device area. Then, plural ion implantation processes are performed. Consequently, N-well regions NW2, NW3, P-well regions PW1, PW2 and deep N-well regions DNW1, DNW2 are formed under the surface of the semiconductor substrate Psub and in the logic device area. In addition, the P-well region PW1 is formed in the deep N-well region DNW1, and the P-well region PW2 is formed in the deep N-well region DNW2.

Please refer to FIG. 7E again. The N-well region NW2 is formed under the surface of the semiconductor substrate Psub and arranged between the isolation structure 705 and the isolation structure 706. The P-well region PW1 and the deep N-well region DNW1 are formed under the surface of the semiconductor substrate Psub and arranged between the isolation structure 704 and the isolation structure 705. In addition, the P-well region PW1 is formed in the deep N-well region DNW1. The N-well region NW3 is formed under the surface of the semiconductor substrate Psub and arranged between the isolation structure 703 and the isolation structure 704. The P-well region PW2 and the deep N-well region DNW2 are formed under the surface of the semiconductor substrate Psub and arranged between the isolation structure 702 and the isolation structure 703. In addition, the P-well region PW2 is formed in the deep N-well region DNW2.

In this embodiment, the N-well region NW1 in the memory device area is formed firstly, and then the N-well regions NW2 and NW3 in the logic device area are formed. In other words, the N-well region NW1 in the memory device area and the N-well regions NW2 and NW3 in the logic device area are not formed simultaneously.

Please refer to FIG. 7F. Then, the photoresist layer 718 is removed. After an etching process is performed, the portion of the bottom oxide layer 711 uncovered by the stack layer is removed. The structure of FIG. 7F is identical to the structure of FIG. 6F. The subsequent steps are similar to those as shown in FIGS. 6G, 6H, 6I, 6J, 6K and 6L of the fourth embodiment, and not redundantly described herein.

From the above descriptions, the present invention provides a manufacturing method for a nonvolatile charge-trapping memory apparatus. During the manufacturing process of the nonvolatile memory apparatus, the blocking layer of the storage device is effectively protected. Consequently, the blocking layer is not contaminated or thinned. Moreover, since the well regions of the logic device area and the memory device area are not simultaneously fabricated, it is feasible to fabricate small-sized nonvolatile memory cell in the memory device area and precisely control the threshold voltage of the charge trapping transistor.

While the invention has been described in terms of what is presently considered to be the most practical and preferred embodiments, it is to be understood that the invention needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A manufacturing method for a nonvolatile charge-trapping memory apparatus, the manufacturing method comprising steps of:
   (A) forming a pad oxide layer on a surface of a semiconductor substrate, and forming plural isolation structures in the semiconductor substrate, wherein through the plural isolation structure, the semiconductor substrate is divided into a memory device area and a logic device area, and the logic device area is divided into an input/output device area and a core device area;

(B) forming a first photoresist layer to cover the logic device area, and forming a first first-type well region under the surface of the semiconductor substrate and in the memory device area;

(C) removing the first photoresist layer and at least a portion of the pad oxide layer, and forming a stack layer in the logic device area and the memory device area, wherein the stack layer comprises a bottom oxide layer, a trapping layer, a blocking layer and a protecting layer;

(D) forming a second photoresist layer to cover a portion of the stack layer in the memory device area, and removing portions of the protecting layer, the blocking layer and the trapping layer that are not covered by the second photoresist layer;

(E) removing the second photoresist layer, and forming a third photoresist layer to cover the memory device area;

(F) forming a second first-type well region, a first second-type well region and a first deep first-type well region under the surface of the semiconductor substrate and in the core device area, and forming a third first-type well region, a second second-type well region and a second deep first-type well region under the surface of the semiconductor substrate and in the input/output device area, wherein the first second-type well region is formed in the first deep first-type well region, and the second second-type well region is formed in the second deep first-type well region;

(G) removing the third photoresist layer, and removing a portion of the bottom oxide layer that is not covered by the protecting layer;

(H) removing the protecting layer of the stack layer, forming an input/output gate oxide layer on the surface of the semiconductor substrate and in the memory device area, forming the input/output gate oxide layer on the surface of the semiconductor substrate and in the input/output device area, and forming a core gate oxide layer on the surface of the semiconductor substrate and in the core device area;

(I) forming a gate layer to cover the memory device area and the logic device area; and (J) forming plural gate structures, and forming plural doped regions, wherein a first gate structure of the plural gate structures is formed over the first first-type well region, a first second-type doped region of the plural doped regions is formed in the first first-type well region and located beside a first side of the first gate structure, and a second second-type doped region of the plural doped regions is formed in the first first-type well region and located beside a second side of the first gate structure, wherein a second gate structure of the plural gate structures is formed over the first first-type well region, the second-type doped region is further located beside a first side of the second gate structure, and a third second-type doped region of the plural doped regions is formed in the first first-type well region and located beside a second side of the second gate structure, wherein a third gate structure of the gate structures is formed over the second first-type well region, a fourth second-type doped region of the plural doped regions is formed in the second first-type well region and located beside a first side of the third gate structure, and a fifth second-type doped region of the plural doped regions is formed in the second first-type well region and located beside a second side of the third gate structure, wherein a fourth gate structure of the plural gate structures is formed over the first second-type well region, a first first-type doped region of the plural doped regions is formed in the first second-type well region and located beside a first side of the fourth gate structure, and a second first-type doped region of the plural doped regions is formed in the first second-type well region and located beside a second side of the fourth gate structure, wherein a fifth gate structure of the plural gate structures is formed over the third first-type well region, a sixth second-type doped region of the plural doped regions is formed in the third first-type well region and located beside a first side of the fifth gate structure, and a seventh second-type doped region of the plural doped regions is formed in the third first-type well region and located beside a second side of the fifth gate structure, wherein a sixth gate structure of the plural gate structures is formed over the second second-type well region, a third first-type doped region of the plural doped regions is formed in the second second-type well region and located beside a first side of the sixth gate structure, and a fourth first-type doped region of the plural doped regions is formed in the second second-type well region and located beside a second side of the sixth gate structure.

2. The manufacturing method as claimed in claim 1, wherein the step (C) further comprises removing the first photoresist layer before removing the pad oxide layer in the logic device area and the memory device area.

3. The manufacturing method as claimed in claim 1, wherein the step (H) comprises sub-steps of:
removing the protecting layer of the stack layer;
forming the input/output gate oxide layer on the surface of the semiconductor substrate;
forming a fourth photoresist layer to cover the memory device area and the input/output device area, and removing the input/output gate oxide layer in the core device area; and
removing the fourth photoresist layer, and forming the core gate oxide layer on the surface of the semiconductor substrate and in the core device area.

4. The manufacturing method as claimed in claim 3, wherein the step (H) comprises forming the input/output gate oxide layer on the surface of the semiconductor substrate before removing the protecting layer of the stack layer.

5. The manufacturing method as claimed in claim 3, wherein the step (H) comprises removing the protecting layer of the stack layer after removing the fourth photoresist layer and before forming the core gate oxide layer.

6. The manufacturing method as claimed in claim 1, wherein the first gate structure comprises the bottom oxide layer, the trapping layer, the blocking layer, the gate layer and a spacer, and the second gate structure comprises the input/output gate oxide layer, the gate layer and the spacer, wherein each of the third gate structure and the fourth gate structure comprises the core gate oxide layer, the gate layer and the spacer, wherein each of the fifth gate structure and the sixth gate structure comprises input/output gate oxide layer, the gate layer and the spacer.

7. The manufacturing method as claimed in claim 6, wherein the first gate structure, the first first-type well region, the first second-type doped region and the second second-type doped region are collaboratively formed as a storage device, and the second gate structure, the first first-type well region, the second second-type doped region and the third second-type doped region are collaboratively formed as a switching device, wherein the third gate structure, the second first-type well region, the fourth second-type doped region and the fifth second-type doped region are collectively formed as a low-voltage second-type transistor, and the fourth gate structure, the first second-type well region, the first first-type doped region and the second first-type doped region are collectively formed as a low-voltage first-type transistor, wherein the fifth gate structure, the third first-type well region, the sixth second-type doped region and the seventh second-type doped region are collectively formed as a high-voltage second-type transistor, and the sixth gate structure, the second second-type well region, the third first-type doped region and the fourth first-type doped region are collectively formed as a high-voltage first-type transistor, wherein the switching device and the storage device are collaboratively formed as a nonvolatile charge-trapping memory cell.

8. The manufacturing method as claimed in claim 1, wherein the bottom oxide layer and the blocking layer comprise silicon oxide, the trapping layer comprises silicon nitride, and the gate layer comprises polysilicon.

9. The manufacturing method as claimed in claim 1, wherein the step (D) further comprises forming the second photoresist layer to cover a least half of the portion of the stack layer in the memory device area.

10. The manufacturing method as claimed in claim 9, wherein the step (H) comprises sub-steps of:
(H1) removing the protecting layer of the stack layer, and forming the input/output gate oxide layer on the surface of the semiconductor substrate;
(H2) forming a fourth photoresist layer to cover the input/output device area and a portion of the blocking layer in the memory device area, removing the input/output gate oxide layer in the core device area, and removing portions of the blocking layer and the input/output gate oxide layer that is included in the memory device area and not covered by the photoresist layer; and
(H3) removing the fourth photoresist layer, and forming the core gate oxide layer on the surface of the semiconductor substrate and in the core device area.

11. The manufacturing method as claimed in claim 10, wherein the step (H1) comprises: removing the protecting layer of the stack layer after forming the input/output gate oxide layer on the surface of the semiconductor substrate.

12. The manufacturing method as claimed in claim 10, wherein the first gate structure comprises the bottom oxide layer, the trapping layer, the blocking layer, the gate layer and a spacer, and the second gate structure comprises the bottom oxide layer, the trapping layer, the gate layer and the spacer, wherein the third gate structure comprises the core gate oxide layer, the gate layer and the spacer, and the fourth gate structure comprises the core gate oxide layer, the gate layer and the spacer, wherein the fifth gate structure comprises input/output gate oxide layer, the gate layer and the spacer, and the sixth gate structure comprises input/output gate oxide layer, the gate layer and the spacer.

13. The manufacturing method as claimed in claim 1, wherein the step (C) further comprises removing the first photoresist layer after removing the pad oxide layer in the memory device area.

14. The manufacturing method as claimed in claim 13, wherein the step (C) further comprises forming the stack layer to cover the pad oxide layer in the logic device area and cover the surface of the semiconductor substrate in the memory device area.

15. The manufacturing method as claimed in claim 13, wherein the step (G) further comprises removing the pad oxide layer.

* * * * *